(12) United States Patent
Tamagawa et al.

(10) Patent No.: US 7,481,616 B2
(45) Date of Patent: Jan. 27, 2009

(54) CENTRIFUGAL FAN, COOLING MECHANISM, AND APPARATUS FURNISHED WITH THE COOLING MECHANISM

(75) Inventors: Toru Tamagawa, Kyoto (JP); Yusuke Yoshida, Kyoto (JP)

(73) Assignee: Nidec Corporation, Kyoto (JP)

( * ) Notice: Subject to any disclaimer, the term of this patent is extended or adjusted under 35 U.S.C. 154(b) by 728 days.

(21) Appl. No.: 10/710,160

(22) Filed: Jun. 23, 2004

(65) Prior Publication Data

US 2005/0042082 A1 Feb. 24, 2005
US 2006/0056964 A9 Mar. 16, 2006

(30) Foreign Application Priority Data

Aug. 21, 2003 (JP) .............................. 2003-297183

(51) Int. Cl.
F04D 29/30 (2006.01)

(52) U.S. Cl. ...................... 415/176; 415/119; 415/177; 415/204; 415/206; 416/178; 416/185; 416/186 R; 416/187; 416/188; 416/223 B; 416/DIG. 2; 416/241 A

(58) Field of Classification Search ................. 415/119, 415/172.1, 204, 206, 175–178; 416/186 R, 416/187, 188, 223 B, 241 A, DIG. 2, 178, 416/185
See application file for complete search history.

(56) References Cited

U.S. PATENT DOCUMENTS

| 5,169,290 | A | * | 12/1992 | Chou ..................... 416/236 R |
| 5,741,118 | A | | 4/1998 | Shinbara et al. |
| 5,813,831 | A | * | 9/1998 | Matsunaga et al. ........ 415/173.6 |
| 5,964,576 | A | * | 10/1999 | Fujita et al. .................. 415/206 |
| 5,988,979 | A | * | 11/1999 | Wang .......................... 416/178 |
| 6,050,772 | A | | 4/2000 | Hatakeyama et al. |
| 6,299,409 | B1 | * | 10/2001 | Matsunaga et al. .......... 415/206 |
| 6,340,291 | B1 | * | 1/2002 | Reckert ...................... 416/185 |
| 6,433,071 | B1 | * | 8/2002 | Arai et al. .................... 524/508 |
| 6,929,452 | B1 | * | 8/2005 | Pargeter et al. ......... 416/186 R |
| 7,217,087 | B2 | * | 5/2007 | Yoshida et al. ................ 415/98 |

FOREIGN PATENT DOCUMENTS

| JP | H05-231393 | A | 9/1993 |
| JP | H05-304379 | A | 11/1993 |
| JP | H07-161889 | A | 6/1995 |
| JP | H08-010697 | Y2 | 3/1996 |
| JP | H08-154871 | A | 6/1996 |
| JP | 2003-307196 | A | 10/2003 |

* cited by examiner

Primary Examiner—Christopher Verdier
(74) Attorney, Agent, or Firm—Westerman, Hattori, Daniels & Adrian, LLP.

(57) ABSTRACT

In a centrifugal fan the diameter of the impeller is rendered less than 20 mm, yet by rotating it under rotational conditions in which the centrifugal force along the impeller periphery is 10,000 m/s² or more, the static pressure that the fan generates is heightened. At the same time, rendering the vane spacing a predetermined width or less reduces noise. Configuring in this way produces a small-scale, high-static-pressure, low-noise fan for cooling electronic devices. Furthermore, by mounting the centrifugal fan on a heatsink having densely arranged heat-dissipating projections a small-scale, high-cooling-capacity, quiet cooling device is realized.

38 Claims, 23 Drawing Sheets

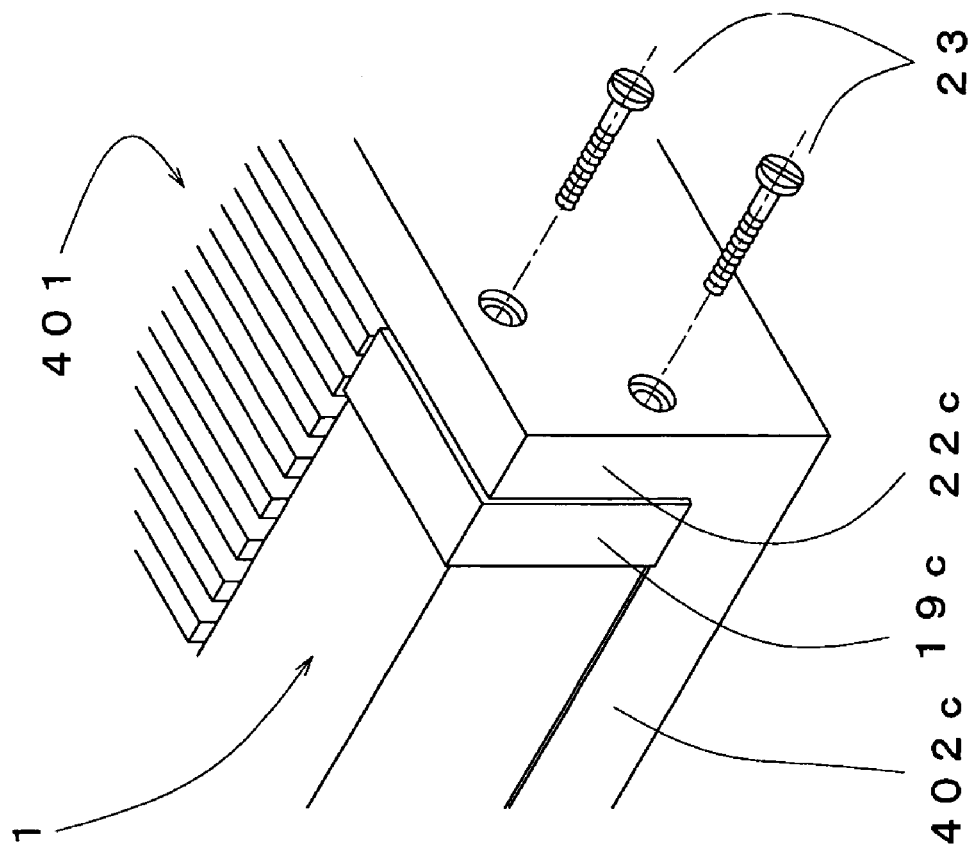
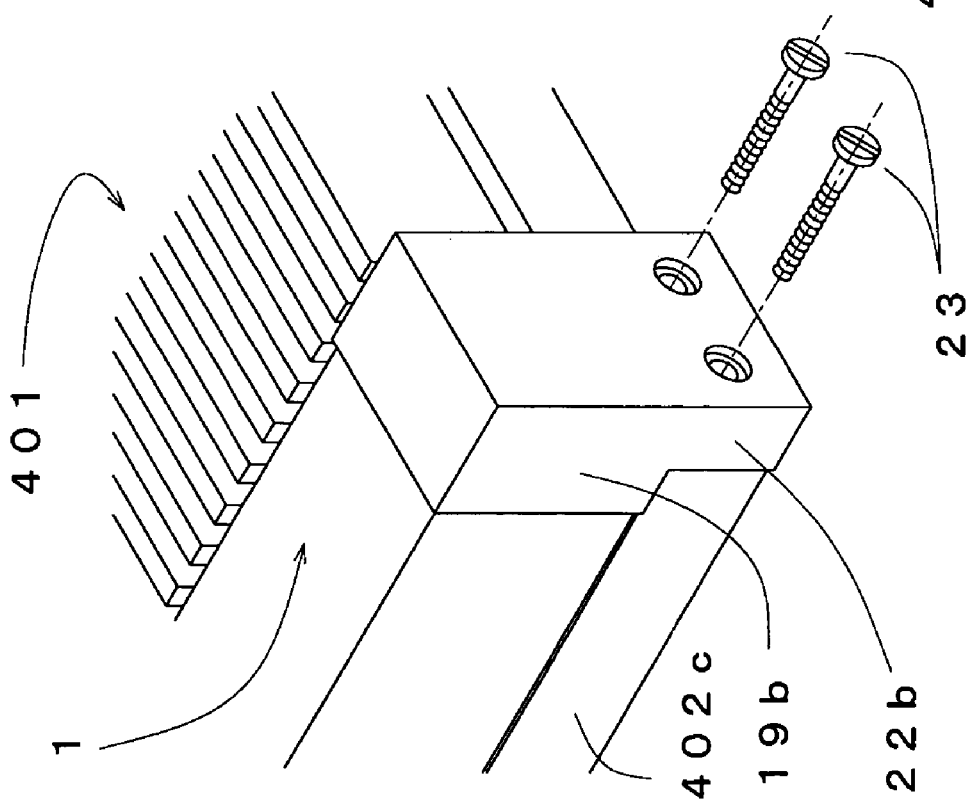

CENTRIFUGAL FAN, COOLING MECHANISM, AND APPARATUS FURNISHED WITH THE COOLING MECHANISM

BACKGROUND OF INVENTION

1. Technical Field

The present invention relates to centrifugal fans suited to cooling miniature devices that give off heat, and to heatsinks that with the centrifugal fan being mounted on them demonstrate excellent performance. In particular the present invention relates to centrifugal fans suited to being built into portable electronic devices, and to heatsinks furnished with the centrifugal fans.

2. Background Art

With upgrading in the performance of electronic devices such as personal computers proceeding rapidly in recent years, there has been a trend toward an increase in the amount of heat issuing from devices such as CPUs, peripheral integrated circuits, hard disks, and power-supply circuits. In addition, as devices are being slimmed down and miniaturized further, the necessity for cooling mechanisms demonstrating sufficient cooling power within narrow confines has arisen. Such trends have been especially pronounced in so-called notebook personal computers. With desktop personal computers also there have been similar demands, owing to the tendency for consumers to prefer more scaled-down products.

What is more, with the further scaling down of, and higher-density mounting of electronic components in, portable telephones, PDAs (personal data assistants), and like devices leading to dramatically upgraded performance, temperature elevation in the interior of the devices is becoming impossible to ignore. New cooling mechanisms are also becoming necessary in such applications as these.

Traditionally for cooling personal computers, axial fans have chiefly been utilized. This is because securing the airflow rate necessary for cooling is comparatively easy. On the other hand, in situations in which, owing to the low static pressure of axial fans on the whole, higher static pressure is required, methods such as utilizing a centrifugal fan, or arranging axial fans in series have been employed.

Fans that provide high static pressure are required for cooling slim-profile notebook computers, which are a target of the present invention, owing to the limited clearances through which air can circulate inside the computer case. At the same time, however, with the fans having to be scaled-down and slim-profile, the heatsinks employed in combination with the fans too must of necessity be slim-profile.

A heatsink and axial fan, devised in order to cool integrated circuits installed in a notebook computer or the like, are set forth in Japanese Pat. Pub. No. 3,392,527. Although in this instance the axial fan is provided with a cylindrical projection to heighten its static pressure, because the fan in and of itself is axial-flow, its static pressure is relatively low. Moreover, the fan's significant windage loss is prohibitive of securing sufficient airflow rate.

An example of a cooling-mechanism configuration in which a centrifugal-fan is installed inside a notebook computer is disclosed in Japanese Unexamined Pat. App. Pub. No. 2003-023128. Although the centrifugal fan, owing to its large static pressure, has sufficient cooling power, the fact that it takes up a large amount of space within the case is a drawback. And while making the case a bit bigger would enable a mechanism of this sort to be installed in notebook computers, applying this technology to the even smaller-scale PDAs, mobile telephones, and similar devices would pose difficulties.

SUMMARY OF INVENTION

Objects of the present invention are: to realize an electronic-device cooling fan that is miniature, has large static pressure, and can secure the necessary airflow volume; and to realize a cooling device in which the fan is installed and that while being miniature has enhanced cooling power. In particular, an object of the invention lies in realizing a centrifugal fan as well as a cooling device that can be installed notebook personal computers, and moreover in devices such as compact PDAs and portable telephones also.

Centrifugal fans have been employed to date as fans used in applications in which static pressure is required. This is because compared with axial fans and cross-flow fans, centrifugal fans demonstrate high static pressure. A known factor in centrifugal fan configurations is that the static pressure tends to be proportional to the square of the peripheral speed of the impeller. For this reason, impellers in which the vane height is made low and the vane diameter is made large have been adopted in designing miniature centrifugal fans.

In the present invention the impeller diameter, rather than being large, is less than 25 mm, which reduces the space that the fan occupies. For accommodating fans with their impeller rotational axis horizontal in slim-profile cases such as those for notebook personal computers, and in order to cool slim-profile, miniature devices, rendering the impeller diameter to be less than 20 mm is more advantageous. Any drawback from an air-delivery-capacity aspect due to the impeller diameter being small is then compensated for by raising the fan rotating speed.

Doing so requires predetermining the rotating speed so that the centripetal acceleration along the impeller periphery will be $1.0 \times 10^4$ m/s$^2$ or more. Though the impeller is rotated under conditions that produce acceleration at this high of a level, the impeller peripheral speed remains comparatively small owing to the small impeller diameter. Despite this, the centrifugal fan nevertheless demonstrates sufficient airflow and high static pressure. Centrifugal force acting on the air is presumably a contributing factor. What is more, while on the one hand the air-delivery capacity of the centrifugal fan is high, noise from the airflow making a grating sound is slight, because the peripheral speed of the impeller is low. A high-static-pressure fan with low airflow noise from the impeller is realized as a result.

In the present invention, determining the inter-vane lateral spacing w along the periphery of the impeller so as to satisfy Formula 1 below enables the performance of the centrifugal fan to be enhanced further.

$$v_\theta \times w / v < 1.0 \times 10^3 \qquad \text{Formula (1).}$$

The left side of Formula 1 is the Reynolds number for a case in which w is deemed to be the characteristic width of the airflow. The centrifugal fan of the present invention is designed so that this number will be less than the fan's critical Reynolds number for laminar flow. In particular, the flow of a fluid will be laminar when the Reynolds number is less than this critical number. While the critical number is affected by the structure of the fan overall, in any case a critical number of less than 1000 is unusual. In the present invention, so that the airflow will be laminar independent of the structure of the fan apart from the configuration of the impeller along its perimeter, w is accordingly determined with 1000 as the upper limit of the Reynolds number.

Under conditions in which the Reynolds number falls below a critical value, a fluid is subject to an intense damping that originates in viscous resistance, making turbulence unlikely to develop. Noise originating in turbulence is therefore diminished. In addition, as a result of the flow of air undergoing strong damping, the air is subject to compressive force between the vanes, raising the static pressure of the outflowing air. In order to obtain this sort of an advantageous effect, however, the fan must be run under conditions in which strong centrifugal force acts on the air between the vanes. The reason for this that under conditions in which the influence of the viscous resistance is strong, because the air takes on a form in which it is captured between the vanes, if strong centrifugal force is not at work the air cannot be adequately sent out of the fan.

Furthermore, in situations in which a narrow region for inter-vane spacing to the extent that satisfies Formula 1 is all that is available on the inner circumferential side of the impeller, the noise-suppressing effectiveness will be less. The reason why is because the location where turbulence arises and generates noise is the outer periphery of the impeller. In cases in which the vanes are arranged radially with respect to the rotational axis, the inter-vane spacing will be smaller at the inner periphery than at the outer periphery, and it will be necessary for Formula 1 to be satisfied at the outer periphery. Conversely, it will not matter if satisfying Formula 1 at the outer periphery means the inner periphery is left not satisfying Formula 1.

Thus, fan silencing may be achieved in accordance with the present invention; likewise, heightened fan static pressure may be accomplished. Nevertheless, with losses being considerable because the fan is run under conditions in which viscous resistance significantly affects flow, the work that the fan does is small by comparison to the energy fed into the fan. Ordinarily, in order to avoid such circumstances a fan is designed so that its Reynolds number will be sufficiently larger than the critical value. In the present invention, however, by deliberately selecting conditions in which the number falls below the critical number, in exchange for the drop in energy efficiency, in another respect performance improvement is realized.

In the present invention, in addition to being configured as described above the centrifugal fan may be rendered slender in form by increasing the height of the impeller, which thereby increases the airflow rate.

The length along the rotational axis of conventional centrifugal fans ordinarily is smaller than the diameter of the impeller. This is because with conventional fans, there has been little improvement in airflow rate from making the fan taller. Nevertheless, thanks to the high air delivery capacity of a centrifugal fan involving the present invention, the fan airflow rate is enlarged by extending the impeller height. To achieve an effect like this it is necessary for the height of the impeller to be equal to or greater than the impeller diameter. On the other hand, once the impeller height is more than 20 times its diameter, even if the height is extended more than that the airflow rate hardly grows any larger, and therefore that height or less is desirable (Formula 2).

$$1 \leq h/(nD) \leq 20 \quad \text{Formula (2).}$$

In turn, in a case in which there are two openings in the impeller, a centrifugal fan of the present invention sucks air in through two openings, and therefore as can be readily understood the airflow rate multiplies. Both the upper and lower limits of the optimal range for the impeller height are doubled in that case. Because the number of openings is 1 or 2, n in Formula 2 assumes a value of 1 or 2.

A centrifugal fan of the present invention may be put into a structure in which it is set up within a housing. This makes it possible for the fan to deliver air intensively in a single direction.

In that case, based on the following Formula 3, a restriction on the shortest separation d between the housing inner circumference and the impeller outer circumferential surface may be added, which further reduces noise originating in disturbances to the flow of air.

$$v_\theta \times d/v < 1.0 \times 10^3 \quad \text{Formula (3).}$$

As explained earlier, designing for a low Reynolds number in a centrifugal fan of the present invention contributes to suppressing turbulence in and reducing noise from the fan. While in deriving Formula 1 attention was directed to the flow of air passing between the impeller vanes, with the aim of reducing noise originating there, the generative source of turbulence lies elsewhere. In formulating Formula 3, attention is focused on the clearance between the impeller outer circumference and the housing, and a limitation is placed on the shortest distance d in this clearance. This is because turbulence is more likely to occur in the portion of the fan where the clearance separation is shortest, which is where the average flow speed of the air is fastest.

As a bearing mechanism that supports the impeller in a centrifugal fan of the present invention, a mechanism without ball bearings may be utilized, such as a bearing mechanism made from an oil-impregnated porous material, or a hydrodynamic bearing mechanism, or else a magnetic levitation bearing mechanism. Such bearing mechanisms contribute to further reducing noise arising in the bearing, since rolling sounds produced in between the balls and the outer or inner races that constitute a ball bearing are eliminated. Owing to its improved silence, this centrifugal fan is exceedingly suited to installation in portable products in particular.

The impeller for a centrifugal fan of the present invention may be lent a symmetrical structure in which the characteristics do not change whether the impeller is spun one way or the other. The vane structure in a thus configured centrifugal fan of the present invention does not overly compromise the fan performance characteristics. Joining back-to-back two impellers of identical configuration is ideal for applications constructing a fan in which both ends of the impeller are made open.

In a centrifugal fan of the present invention the impeller, at least, may be formed with a liquid-crystal polymer in which reinforcing fibers are dispersed being the raw material.

In molding the particularly small-diameter impellers that are the subject of the present application, because the vanes constituting the impeller are extremely fine and the gap between vanes is diminished, getting the synthetic polymer to spread throughout the interior of the mold is difficult. Nevertheless, such trouble may be averted with a liquid-crystal polymer, thanks to its extremely high flowability in the uncured state. Moreover, with the post-curing strength and rigidity of a liquid-crystal polymer being high, in separating the impeller from the mold, incidents such as injury to the vanes will be scarce, which improves productivity. What is more, owing to the high strength/high rigidity that a post-curing liquid-crystal polymer exhibits, the impeller will sufficiently withstand high-speed rotation under large centrifugal force, leading to enhanced reliability.

In a centrifugal fan of the present invention, the configuration of the impeller may be rendered in a form that satisfies the following Formula 4.

$$1 \leq S_{out}/S_{in} \leq 30 \quad \text{Formula (4).}$$

Formula 4 signifies $S_{out}$, the sum of adding together the inter-vane spacing w and the axial length h of the vanes around the entire circumference of the impeller, being brought within a range of from 1 to 30 times the surface area $S_{in}$ of the impeller opening(s). Thus rendering the impeller configuration ensures the fan's airflow rate in that excessive resistance will not be put on the delivery of air through the impeller lateral sides. It should be noted that although $S_{out}$ being over 30 times $S_{in}$ does not mean that the airflow rate will decrease, a fan configuration in which $S_{out}$ is over 30 times $S_{in}$ would work against gaining any further advantage in increased airflow. Moreover, manufacturing an impeller to such specifications would be impractical.

Further to the configurations discussed above, in a centrifugal fan of the present invention the radially inward corner at the end of the impeller along its rotational axis may be worked into an arcuate bevel. Doing so enables reducing noise further, since the flow of air sucked into the impeller becomes smoother, which reduces air disturbance.

Heat-emitting components on a circuit board can be cooled by employing a centrifugal fan of the present invention. This is accomplished by anchoring the centrifugal fan to the circuit board or an associated part, with the delivery port of the centrifugal fan having been put near the heat-emitting component. The simple configuration contributes to realizing lowered costs. Moreover, heat-emitting objects, such as integrated circuits and regulators, mounted on a board within a case can be cooled even in instances in which within the case the ventilation impedance is large and resistance to air circulation is great.

A cooling device of the present invention is one in which a centrifugal fan as described above is combined with a heatsink to render a miniature, high-cooling-capacity cooling device having a heatsink. Owing to the centrifugal fan's large static pressure, the fan will function in combination even with a heatsink that, in having high-density fins, has considerable resistance to air circulation.

Any sort of conformation for the heatsink is effective, so long as the heatsink is configured so as to take in heat from heat-emitting objects by heat conduction and transmit the heat to the airflow delivered to the heatsink from the centrifugal fan. One example of what can be employed is a heatsink having a conformation that includes a plate-like base portion, that in one side is in thermal contact with a heat-emitting object such as a CPU, and that has numerous heat-dissipating projections extending from the other side. It will be appreciated that between the heat-dissipating projections spacing (air circulation paths) that will allow air to circulate has to be secured.

Another cooling device of the present invention is made by combining with a heatsink a centrifugal fan installed within a housing. Owing to the centrifugal fan's large static pressure, the fan will function in combination even with a heatsink that, in having high-density fins, has considerable resistance to air circulation. Inasmuch as airflow is concentrated unidirectionally by the housing, a small-scale, high-cooling-capacity cooling device can be achieved.

Yet another cooling device of the present invention is configured from a lesser number of parts because a portion of the fan housing is shared with part of the heatsink. Here too the cooling capacity increases.

In a different cooling device of the present invention, the base part of a fan is anchored in abutment with the base part of a heatsink, whereby vibrations produced by the fan are withstood by the base part to make for further suppression of vibration and noise. The fan may be anchored by forming an extension from the fan base and/or an extension from an edge of the heatsink, and fastening the fan through the extension(s).

In a further cooling device of the present invention, the rotational axis of the centrifugal fan is perpendicular to the heatsink base. This contributes to reducing the area that the cooling device occupies.

In a still further cooling device of the present invention, the centrifugal-fan rotational axis is positioned by a lateral side of the heatsink. This makes it possible to structure lower the height of the cooling device overall.

In another cooling device of the present invention, the rotational axis of the centrifugal fan is displaced from being at right angles with an array of heat-dissipating members on the heatsink. A cooling device having a higher cooling capacity is achieved through this configuration. This is due to the following reasons.

The airflow produced by a centrifugal fan of the present invention does not head in a direction perpendicular to the fan's rotational axis. The impact of this is especially pronounced in situations in which the fan axial length has been extended. As a consequence of the airflow's directional tendency, if the rows of heat-dissipating members on the heatsink were made perpendicular to the rotational axis, then the air delivered from the centrifugal fan would collide futilely with the heat-dissipating members and be scattered, compromising the efficiency with which the fan cools the heatsink. Given this, arranging the heat-dissipating members at a diagonal with respect to the rotational axis reduces wasteful breakup and scattering of the airflow to enhance the capacity of the centrifugal fan to cool the heatsink. A similar configuration is efficacious also in cases in which the centrifugal fan is combined with a heatsink of a makeup in which cooling fins rather than heat-dissipating members are arranged in rows.

Here, the angle of the cooling-fin/projection rows must be displaced by at least 10 degrees from a right angle to the rotational axis; 15 degrees or more is preferable. By the same token, if the rows are slanted by more than 85 degrees, the airflow passage rather than being smoothed would instead be harmed, which would diminish the cooling efficiency; therefore the angle must be less than this value. More preferably the angle is less than 80 degrees.

In addition, because the angle of the airflow with respect to the centrifugal fan axis changes depending on the position along the axis, the fan may be configured so that the aforementioned angle by which the rows are slanted also varies in accordance with the position. This enhances the cooling efficiency further.

In a different cooling device of the present invention, a plurality of fans is installed on a single heatsink. The cooling capacity of a cooling device of this configuration is higher still.

In another cooling device of the present invention, the heatsink is constituted from a heat-transmissive porous material, wherein the pore regions serve as air circulation paths. The porous material has a pore volume ratio of 50% to 90% in volume fraction. Although the resistance during circulation will be larger than with an ordinary heatsink, with a centrifugal fan of the present invention being combined even with a heatsink of this sort, because the fan static pressure is high the cooling device will perform well.

In accordance with the present invention a device equipped with a cooling mechanism will have an air-suction port on the lateral side of its case and inside will have a centrifugal fan that develops large static pressure, and yet for all that, with the impeller diameter being less than 25 mm the device height will be low, which allows the device overall to be made thin-profile. The features that the present invention makes possible in the device configuration mean that the device case may be rendered thin-profile and yet a case interior space in which air is sucked in through the lateral side and the air ventilation impedance is large will be realized. With conventional centrifugal fans and axial fans, particularly in applications in which they are mounted in thin-profile cases, there was no choice but to put the suction port in the bottom side of the case. That configuration meant not only that the intake efficiency suffered, but also that relatively high-temperature air would be sucked into the fans, because the air would be warmed as it came flowing in along the bottom side of the case.

In a further aspect of the present invention, in a device equipped with a cooling mechanism regulating plates for controlling the flow of air may be further installed within the device case, making it so that by sending the airflow to the required places, cooling without waste is possible.

From the following detailed description in conjunction with the accompanying drawings, the foregoing and other objects, features, aspects and advantages of the present invention will become readily apparent to those skilled in the art.

BRIEF DESCRIPTION OF DRAWINGS

FIGS. 15A and 15B illustrate fastening methods for the fourth-embodiment centrifugal fan;

DETAILED DESCRIPTION

Preferred modes for embodying the present invention are set forth in Embodiments 1 through 9 below. Miniature, low-noise centrifugal fans of large static pressure and large airflow rate were realized by means of the configurations in the embodiments. In turn, by mounting the centrifugal fans onto a heatsink, miniature and high-cooling-power fan-assisted heatsinks were realized. Moreover, devices in which the heat-generating objects within the device case were efficiently cooled were realized by installing these centrifugal fans within the cases.

EMBODIMENT 1

Figure 1:
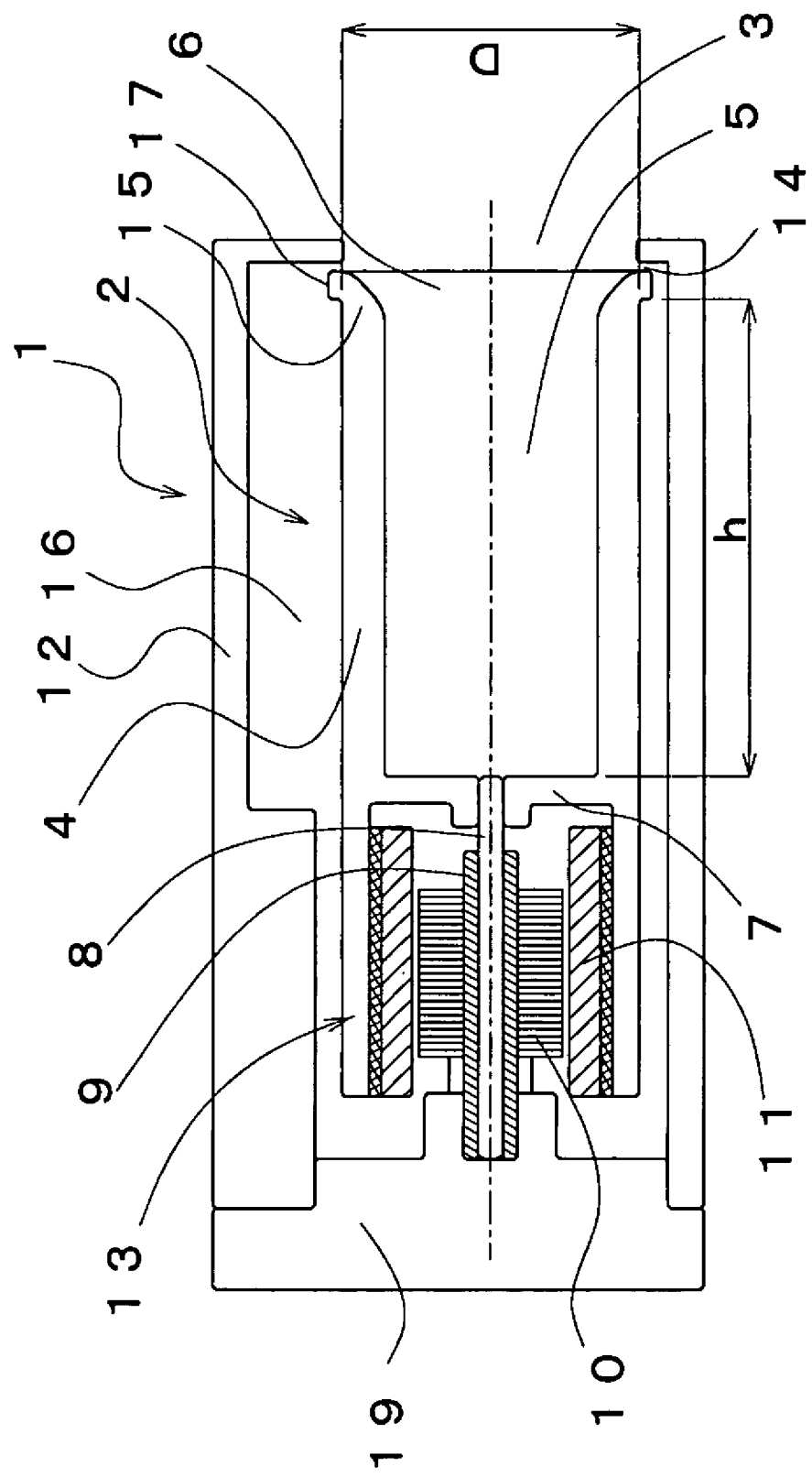
FIG. 1 is an axially oriented sectional view of a centrifugal fan in a first embodiment of the present invention.
Figure 2:
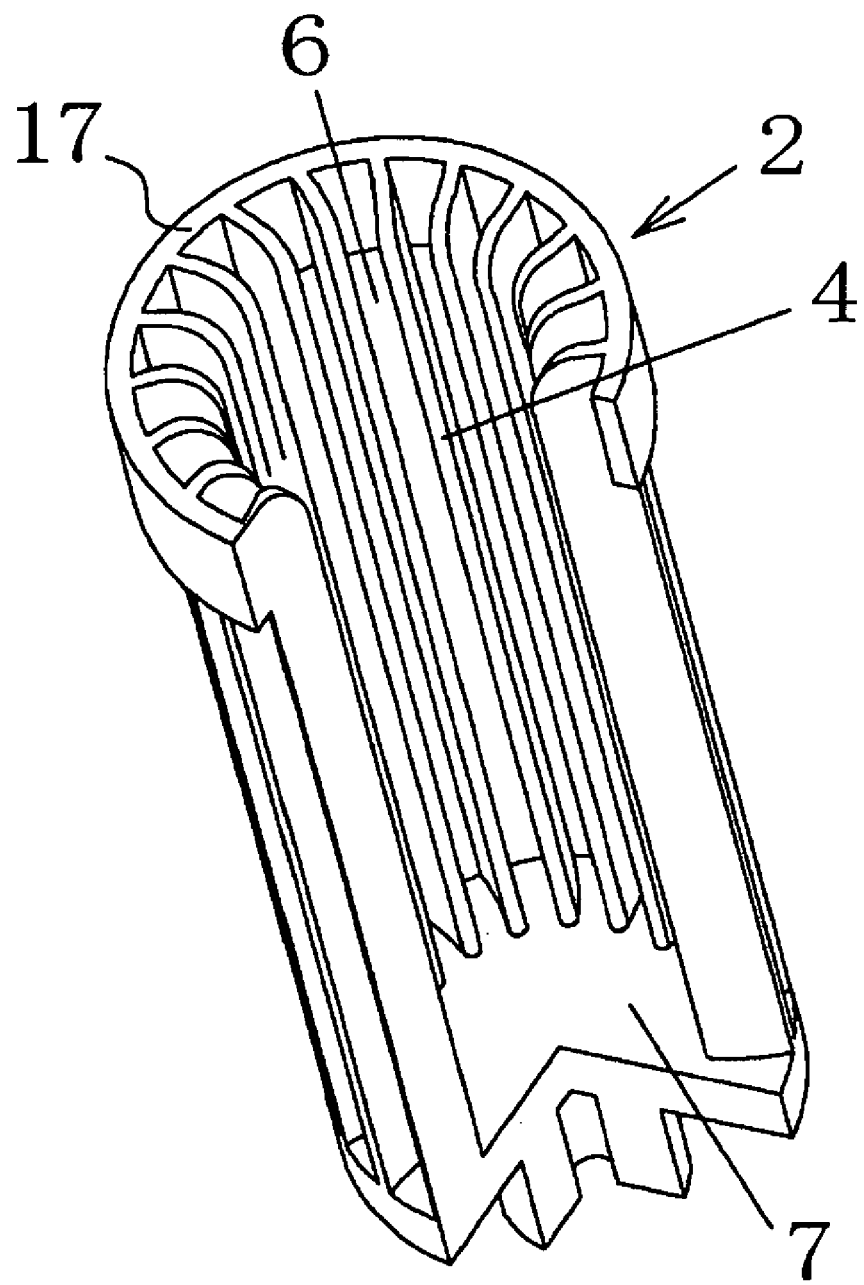
FIG. 2 is an oblique view of an impeller that is a component of a centrifugal fan of the first embodiment.

(1) Configuraton—Using FIGS. 1 through 3, an explanation of a centrifugal fan involving a first mode of embodying the present invention will be made. FIG. 1 illustrates a section through the centrifugal fan 1 in a plane in which the fan rotational axis lies. The centrifugal fan 1 is made up of an impeller 2, an outer-rotor motor 13 that rotationally drives the impeller 2, and a housing 12 that houses the impeller 2 and the motor 13. In the figure, "D" indicates the outer diameter of the impeller 2, which in this example is 6.75 mm. The impeller 2 has a plurality of vanes 4 that extend along the rotational axis, wherein the region encompassed by the vanes 4 forms a cavity 5. As an embodiment, the cavity is approximately circular-cylindrical as illustrated in FIGS. 1 and 2. The cavity 5 along one end forms an opening 6, while the other end is closed off by a disk-shaped wall 7. Furthermore, the inner-circumferential edge of the fore ends of the vanes 4 along the opening 6 are worked into a bevel 15 so that the flow of sucked-in air is not disturbed. As an embodiment, at least a protion of the radially inward corner of the vanes 4 is chamfered at the axial end of the vanes along the impeller opening (opening 6), as illustrated in FIG. 1.

The impeller 2 is fixed to a shaft 8 in the center of the wall 7 with the shaft 8 being inserted through a sleeve 9 in which it is supported while allowed to rotate. The shaft 8 and the sleeve 9 constitute a bearing section, with the bearing section fixed to a base 19 for the motor part of the fan. The motor 13 is configured on the side of the wall 7 opposite the cavity 5. A stator 10 and rotor magnet 11 are a part of the motor 13; passing current to the stator 10 generates rotational driving force centering on the shaft 8. It will be understood that in FIG. 1 the lead wires for supplying electric power to the stator 10 have been omitted. In an embodiment, the impeller 2 has a circular surface serving as a bearing surface on a projecting prortion connected with either the circumferential portion or an axial end portion of the impeller 2. Via the circuital surface, the bearing mechanism rotatably supports the impeller.

Reference is made to FIG. 2, which is an oblique view of the impeller 2. A reinforcing ring 17 is provided on the end of the vanes 4 around the opening 6. In the invention that is the subject matter of the present application, because the impeller is spun at speeds far higher than what is ordinary, a strong force that tends to flare the vane tips radially outward acts on the vanes 4 and can destabilize their behavior as a fan. Nevertheless, by furnishing this ring structure the vanes 4 are reinforced, whereby such negative impact is averted.

The impeller 2 is housed inside the housing 12. In the housing 12 is a suction port 3 that has about the same diameter as the opening 6. The clearance 14 between the rim of the opening 6 and the suction port 3 is designed to be small, thus making it difficult for air to pass there. The space between the inner peripheral surface of the housing 12 and the circumference of the impeller 2 constitutes a draft cavity 16. When the impeller 2 is spinning, air blown outward by the vanes 4 flows into the draft cavity 16 and, passing through there, is exhausted through a delivery port 18 (FIG. 3).

The impeller 2 is rotationally driven by the motor 13 at 20,000 rpm. In that respect, the centripetal acceleration at the impeller perimeter is 14,800 m/s$^2$, which—being substantially larger than 10,000 m/s$^2$—produces high static pressure. As noted earlier, the outer diameter of the impeller 2 (D in FIG. 1) is in this example 6.75 mm. The axial length of the impeller part—indicated by h—of the centrifugal fan in this instance is 10 mm. Because the number of openings in the impeller is one, n in Formula 2 is 1. Accordingly, h/(nD) =1.48. This means that the impeller satisfies Formula 2, and thus it has sufficient axial length.

Figure 3:
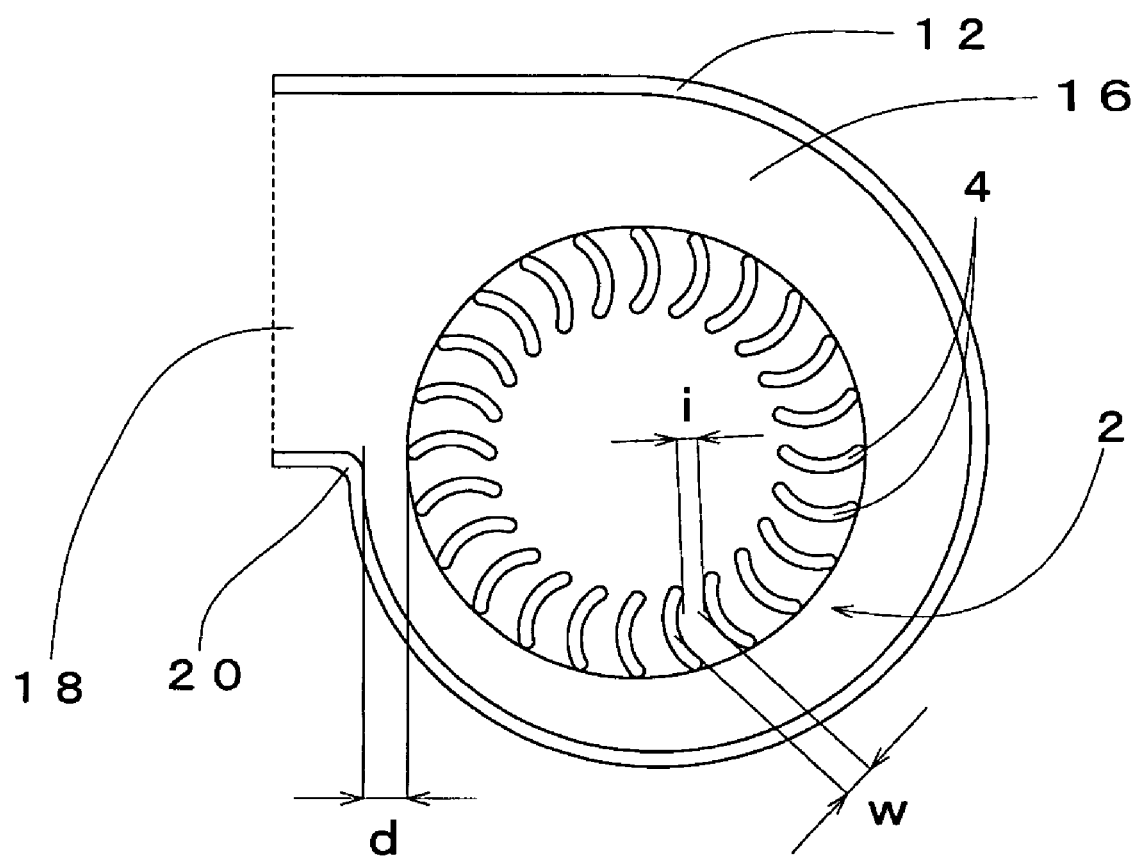
FIG. 3 is an axially perpendicular sectional view of a centrifugal fan of the first embodiment.

Reference is now made to FIG. 3, which is a sectional view in a plane perpendicular to the rotational axis of the centrifugal fan. The individual vanes 4 in their arrangement composing the impeller 2 are separated by a fixed spacing, and along the periphery of the impeller the inter-vane lateral separation w=0.50 mm. Furthermore, the inter-vane spacing is shortest along the inner circumference of the impeller 2, being i=0.31 mm. Since there are 24 vanes in this embodiment, $S_{out}$ in Formula 4 is 74 mm$^2$. From D=6.75 mm, $S_{in}$ in is 35.8 mm. With $S_{out}/S_{in}$ exceeding 1, Formula 4 is satisfied.

Under a 20,000 rpm rotating condition, along the circumferential surface of the impeller 2 the peripheral speed $v_\theta$=7.07 m/s; therefore, with the kinematic viscosity of air being v=1.77×10$^{-5}$ m$^2$/s$^2$ (value at 50 degrees Centigrade), the left side of Formula 1 will be 200, which falls below 1000. This means that the centrifugal fan here satisfies Formula 1.

In FIG. 3, d is the clearance, along a tongue part 20 of the housing 12, between the periphery of the impeller 2 and the housing 12 inner circumferential surface. Because the clearance between the impeller 2 and the housing 12 is of a form that expands heading toward the delivery port 18 while describing a logarithmic spiral, the clearance becomes smallest adjacent the tongue part 20. The clearance there is d, and in Embodiment 1 d=0.5 mm. Substituting this value into Formula 3 makes the right side 200, which turns out to be below 1000. This means that the centrifugal fan here satisfies Formula 3.

By satisfying Formulas 1 and 3, the centrifugal fan of Embodiment 1 realizes a low-noise fan in which noise generated both by the impeller, as well as between the impeller and the draft cavity, is low.

Figure 4:
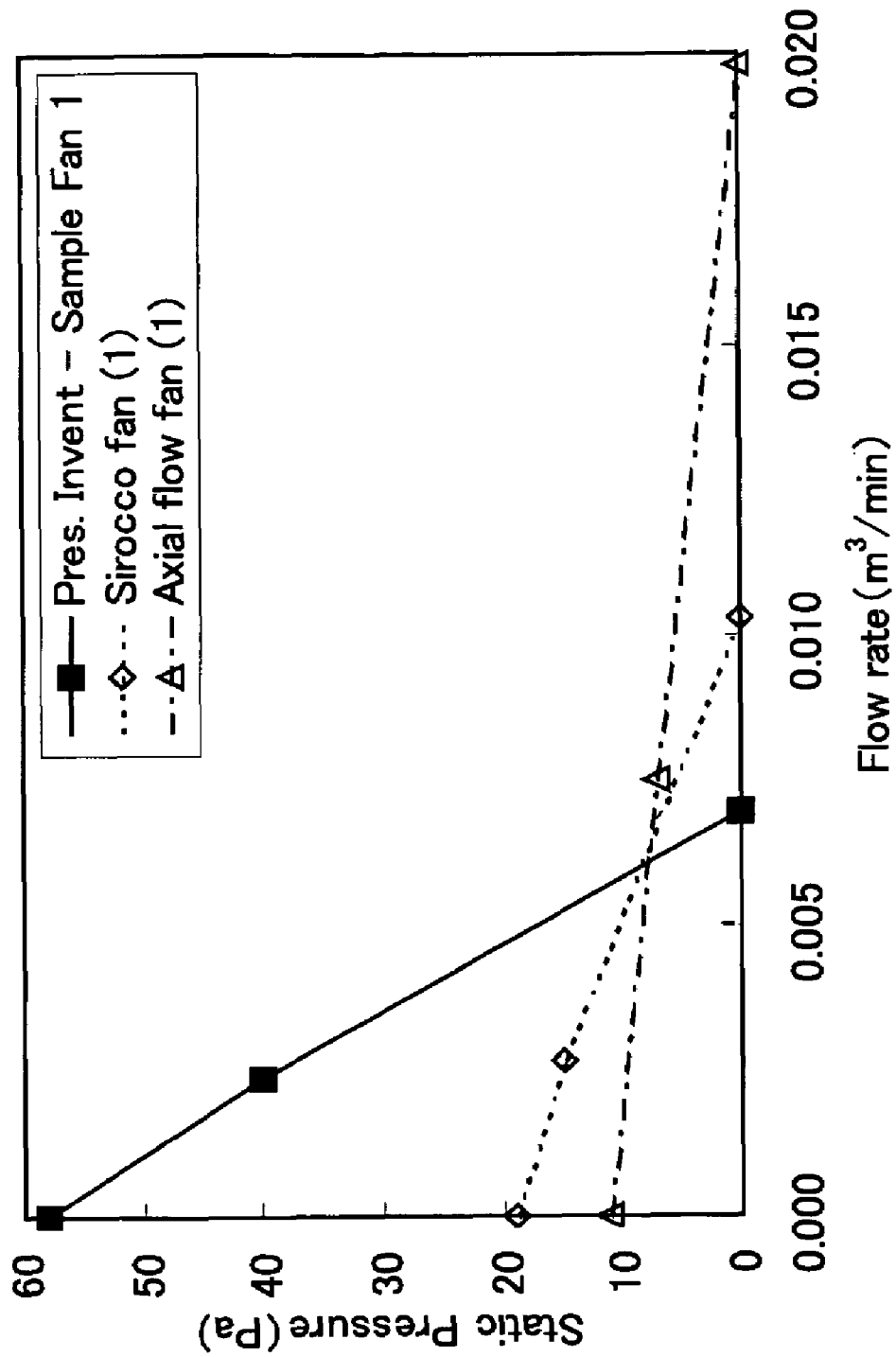
FIG. 4, a first chart, compares the performance of a centrifugal fan in the first embodiment of the present invention with that of conventional types of fans.

(2) Performance—Airflow rate vs. static pressure characteristics for the present-invention centrifugal fan 1, illustrated in FIG. 1, and for a conventional type of sirocco fan and an axial fan, are plotted together in the FIG. 4 graph. In the graph, "Pres. Invent. Sample Fan 1" indicates the centrifugal fan 1 of FIG. 1.

The centrifugal fan 1 whose performance is represented in the graph is one in which the above-described 6.75-mm diameter, 10-mm length impeller is housed in a housing 10 mm square and 22 mm long, and which is rewed at 20,000 rpm. Likewise, the size of the sirocco-fan housing is 15 mm square and 22 mm long, while the size of the axial-fan housing is 10 mm square and 7 mm long, and the fans in both cases are rewed at 7000 rpm. It should be noted that with regard to the axial fan, the sum of the volumetric flows for three fans of identical size is plotted. The volume of each fan regarded in terms of the housings, given that the housings are deemed to be parallelepipeds in form, is 2.2 cm$^3$ for the fan of FIG. 1, 2.3 cm$^3$ for the sirocco fan, and 2.1 cm$^3$ for the set of three centrifugal fans, meaning that the volumes are roughly the same.

Such being the case, the relative merits as to the performance of the fans can, given that the fan outer dimensions are taken to be regular, be read from FIG. 4. Clearly the centrifugal fan of the present invention wins out in performance. In particular, under relatively low volumetric flow conditions, it exhibits far and away the higher static pressure compared with the other, conventional fans. Thus, although its capacity for requisite airflow is comparatively small, the centrifugal fan 1 of the present invention is ideally suited to cooling compact electronic devices in which parts are mounted at high density—applications in which high static pressure is demanded. Likewise, the centrifugal fan 1 is ideally suited to applications in which it is employed to configure cooling devices in combination with miniature heatsinks whose cooling-projection density is high.

EMBODIMENT 2

Figure 5:
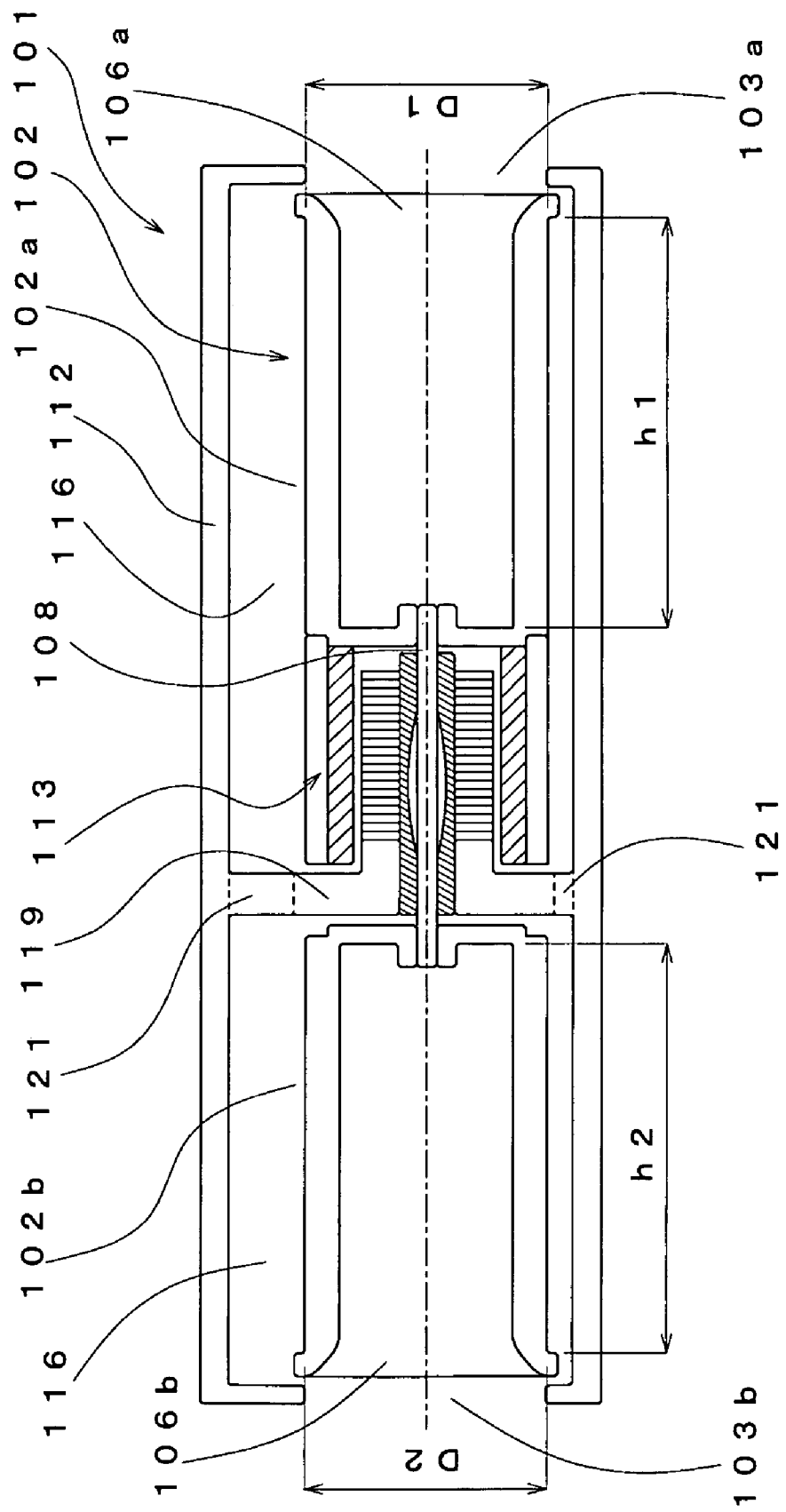
FIG. 5 is an axially oriented sectional view of a centrifugal fan in a second embodiment of the present invention.

(1) Configuraton—A centrifugal fan involving a second embodiment of the present invention will be explained using FIGS. 5 through 8. FIG. 5 is a diagram of a centrifugal fan 101 in section along its rotational axis. In this centrifugal fan, differing from the fan detailed in Embodiment 1, two impeller components, 102a and 102b, connected by a shaft 108 configure a single impeller unit 102. Present in the ends of the impeller unit 102 are respective openings 106a and 106b.

A single motor component 113, an outer-rotor type, alone drives the impeller unit 102, and is formed unitarily with the impeller component 102a on one side of the fan. The impeller unit 102 and the motor component 113 together are housed inside a housing 112, wherein via a base 119 the motor component 113 is connected to and supported by the housing 112. While the draft cavity 116 in which the impeller unit 102 is accommodated does end up being partitioned in two by the base 119, a plurality of communicating holes 121 is provided in the base 119. Doing so makes the air pressure across the left and right air cavities uniform and, even in situations in which the load on the left and right of the centrifugal fan differ, enables the load to be spread throughout the fan.

With the individual impeller components 102a and 102b that are constituent elements of the impeller unit 102 being 12 mm in diameter and 30 mm in length, the effective length of the vane portions of the impeller unit 102 as a whole is 60 mm.

The impeller 102 is rotationally driven at 20,000 rpm by the motor component 113. Along the impeller periphery at that time the centripetal acceleration, being 26,300 m/s$^2$, is sufficiently large such that high static pressure is produced. The fact that the number of openings in the impeller unit 102 is two means that n in Formula 2 is in this case 2. Hence h/(nD)=2.5, meaning that the impeller unit 102 satisfies Formula 2 and has sufficient length in axial extension.

Figure 6:
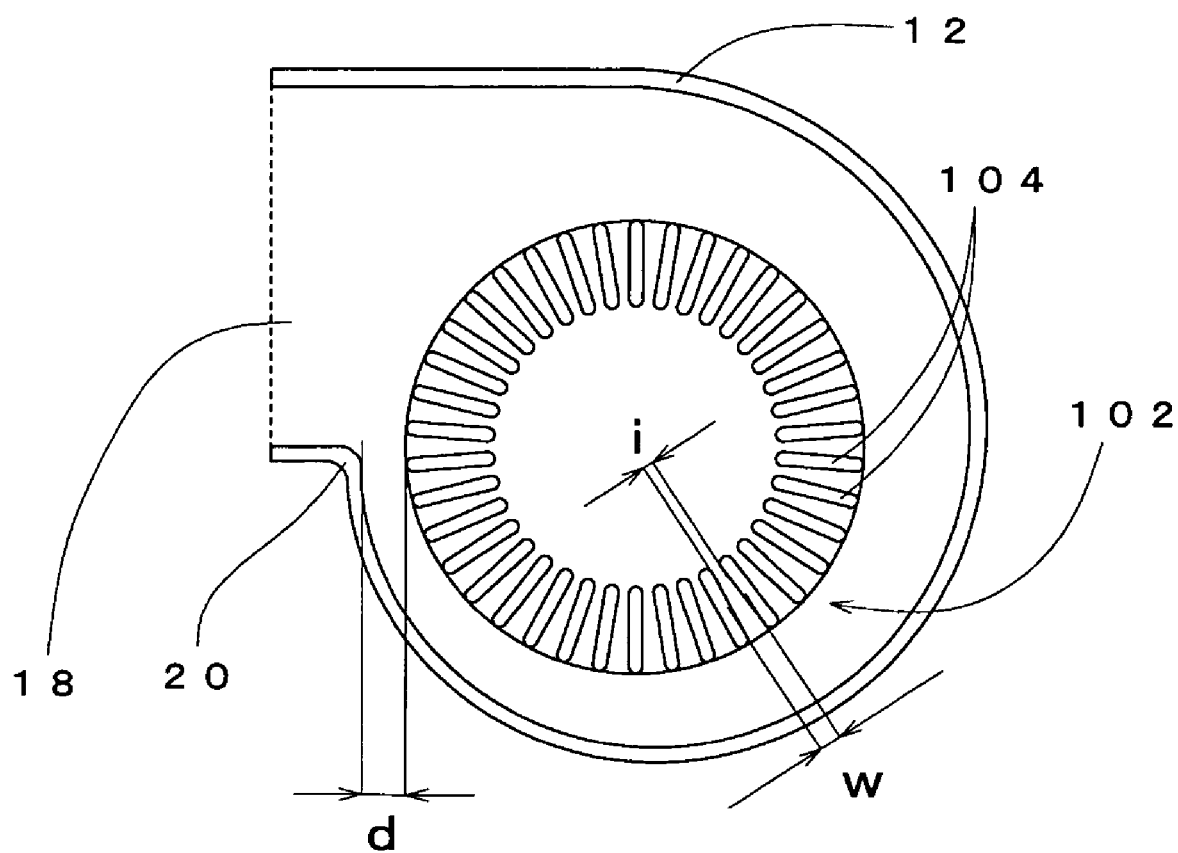
FIG. 6 is an axially perpendicular sectional view of the centrifugal fan of the second embodiment.

Reference is made now to FIG. 6, a sectional view through a plane perpendicular to the rotational axis of the centrifugal fan 101. While the respective forms of the housing 12 and delivery port 18 are analogues to those of the centrifugal fan 1 described in the foregoing, the vanes 104 are different. Specifically, in contrast to the outer peripheral sides of the vanes 4 being tilted going in the direction of rotation, the vanes 104 are radially symmetrical in form. Although thus rendering the form of the vanes somewhat compromises the impeller performance, the advantage is that the impeller will demonstrate the same performance rotated in either direction. In a plane perpendicular to the rotational axix, the cross-sectional form of each of the vanes 104 including the impeller has an exis of symmentry, and the axis of symmentry is coincident with a radius of the impeller.

With the centrifugal fan 101 being made up of the two sections 102a and 102b, the positional relationship in each between the intake route and the route through which air is blown out is different. However, because the adoption of a vane form such as that of the vanes 104 makes it possible to appropriate identical parts for the sections 102a and 102b, the number of different parts can be reduced, as can the manufacturing costs.

The vanes 104 are arranged evenly spaced in circular orientation, with the separation w in FIG. 6 between the sides of the vanes at their periphery being 0.60 mm. The inter-vane spacing is shortest along the inner circumference of the impeller unit 102, being i=0.28 mm. Furthermore, the distance d between the impeller unit 102 and the housing 12 along the tongue part 20 is 1.22 mm.

Along the impeller periphery at a rotating speed of 20,000 rpm, the peripheral speed $v_\theta$=12.6 m/s; therefore, when the kinematic viscosity of air—$v$=1.77×10$^{-5}$ m/s2 (value at 50 degrees Centigrade)—is substituted into the left side of Formula 1, the result is 423, which falls below the upper limit on the right side of Formula 1. Accordingly, the fan of Embodiment 2 satisfies Formula 1. Likewise, the left side of Formula 3 becomes 866, which is smaller than 1000, satisfying Formula 3.

There are 38 of the vanes 104 that constitute the impeller unit 102. The effective length of the vane portions, in terms of each of the two impeller components 102a and 102b mounted on the ends of the rotary shaft, is 30 mm; that of the two impeller components taken together is 60 mm. From the value of i just indicated and this effective length, $S_{out}$=640 mm$^2$; $S_{in}$ is 113 mm$^2$, which also satisfies Formula 4.

Figure 7:
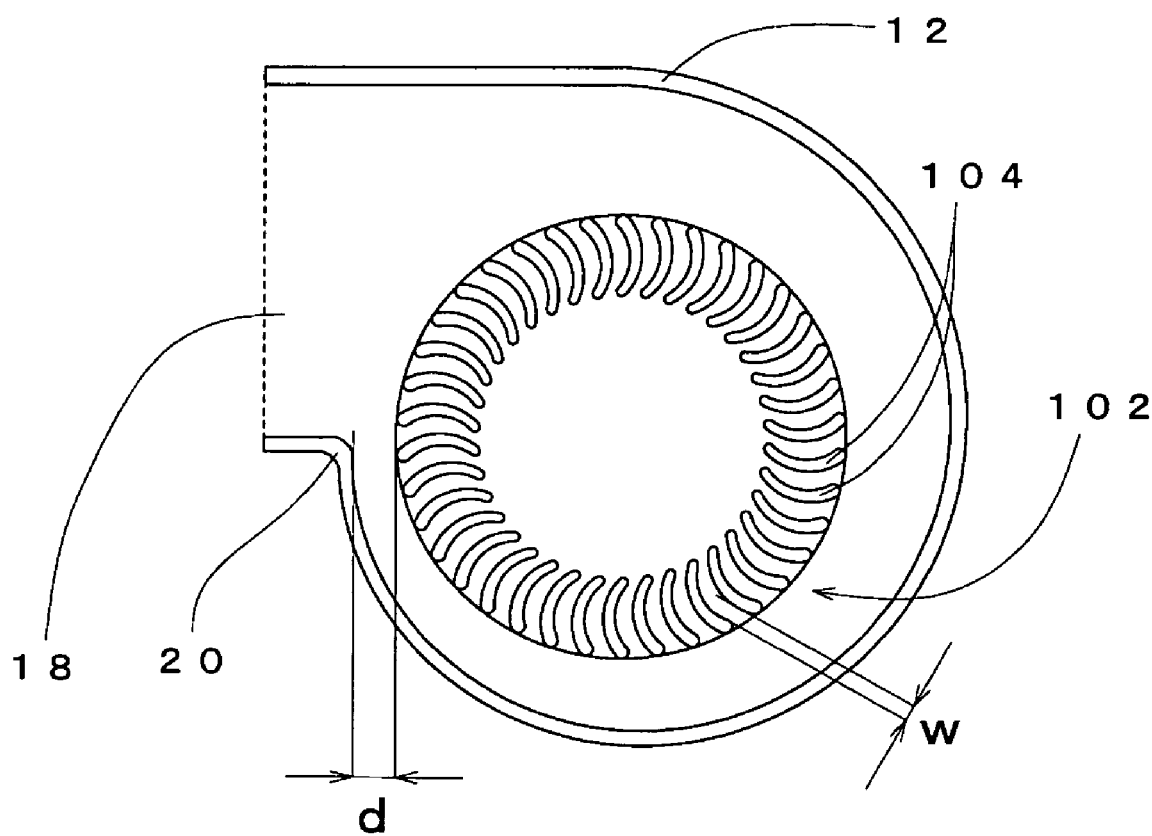
FIG. 7 is a first modified example of the (second-embodiment) centrifugal fan as illustrated in FIG. 6.

(2) Modified Example 1—The form of the vanes 104 that constitute the impeller unit 102 in the centrifugal fan 101 may be altered. The vanes, rather than being radially symmetrical as illustrated in FIG. 6, may be rendered in the forward-inclined form illustrated in FIG. 3. Such an example is illustrated in FIG. 7. Although thus rendering the vanes raises manufacturing costs, it improves the performance of the impeller, and enhances the performance of the centrifugal fan.

Figure 8:
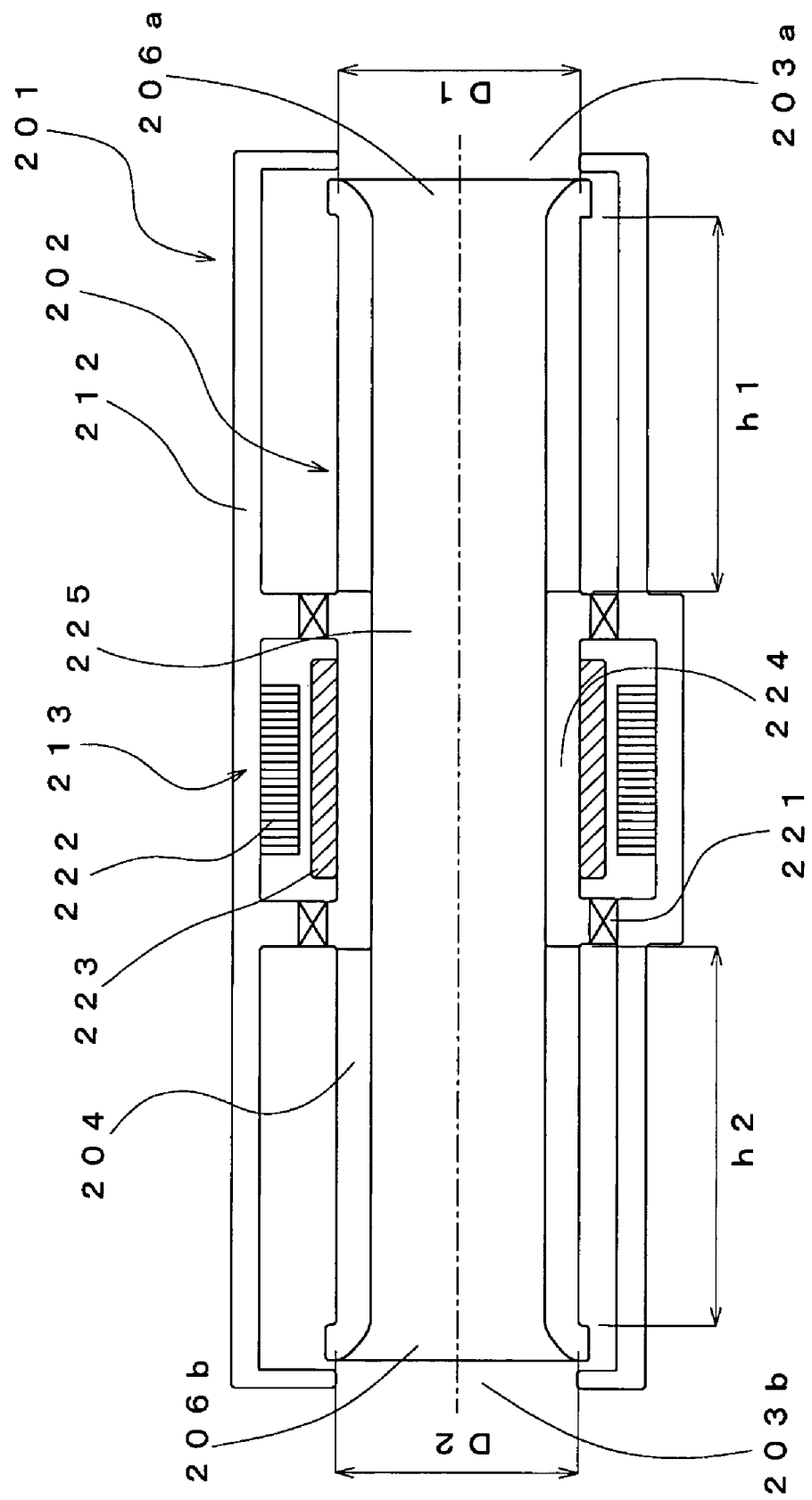
FIG. 8 is a second modified example of the (second-embodiment) centrifugal fan as illustrated in FIG. 5.

(3) Modified Example 2—The motor 113 in the centrifugal fan 101 can also be an inner-rotor type. An example of this is illustrated in FIG. 8. The centrifugal fan 201 is an example configured in an inner-rotor form, wherein the motor component 213 is one whose stator 222 is mounted on the inner circumferential surface of the housing 212 and whose rotor magnet(s) 223 is mounted on the outer circumferential surface of the midportion of the impeller unit 202. A bearing mechanism 221 mounted interposed between the housing 212 inner circumference and the impeller 202 outer circumference rotatively supports the impeller.

The impeller 202 is made up of a plurality of vanes 204 and a hollow cylindrical base part 224 that supports the vanes, with the rotor magnet(s) 223 and the bearing mechanism 221 being mounted on the base part 224. Ball bearings are suitable for the bearing mechanism, but also suitable is a bearing of an oil-impregnated porous material, in which a sleeve is constituted from an oil-impregnated sintered compact. Likewise, excellent results are obtained with hydrodynamic bearings as well. For lessening rotational resistance aerodynamic bearings or else magnetic levitation bearings are preferable.

Figure 9:
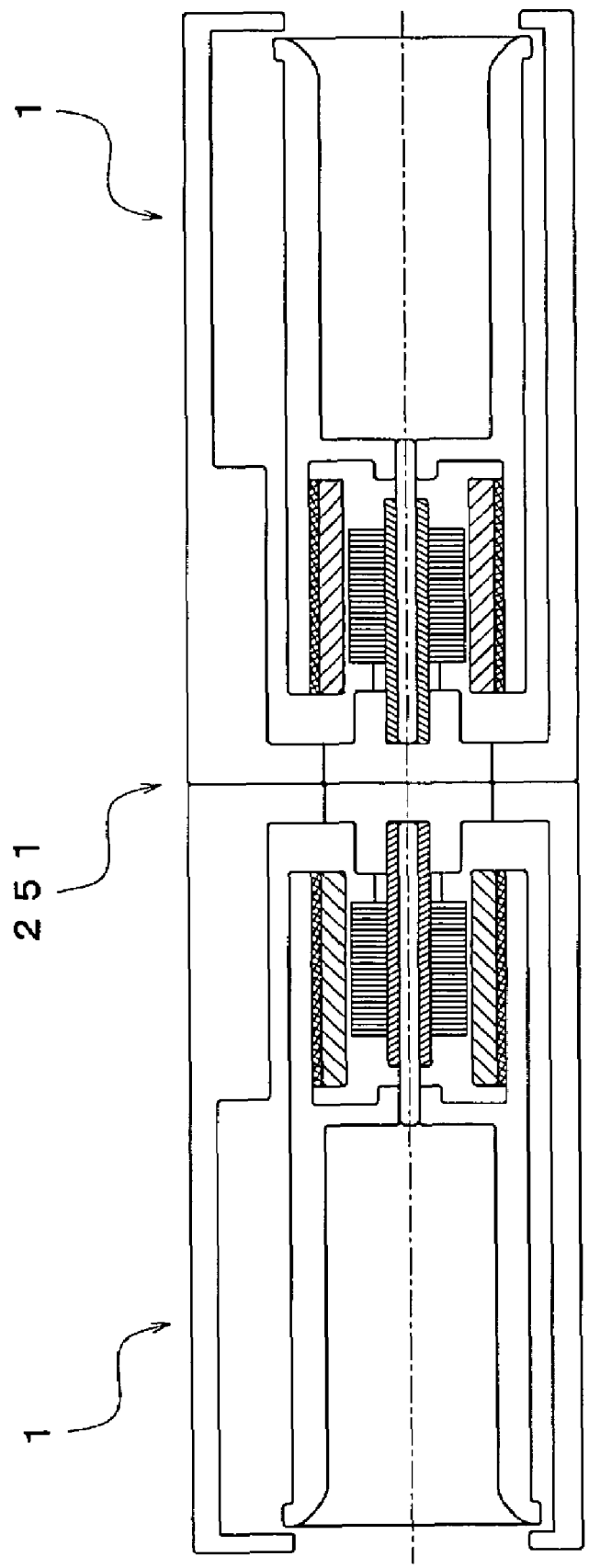
FIG. 9 is a third modified example of the (second-embodiment) centrifugal fan as illustrated in FIG. 5.

(4) Modified Example 3—As exemplified in FIG. 8, a single centrifugal fan 251 can be configured by joining together two centrifugal fans 1, 1 back-to-back. An example of this is illustrated in FIG. 9. In this case, however, the form of the impellers in the two centrifugal fans that are combined must be made the reverse of each other so that their fanning directions are coordinated.

Figure 10:
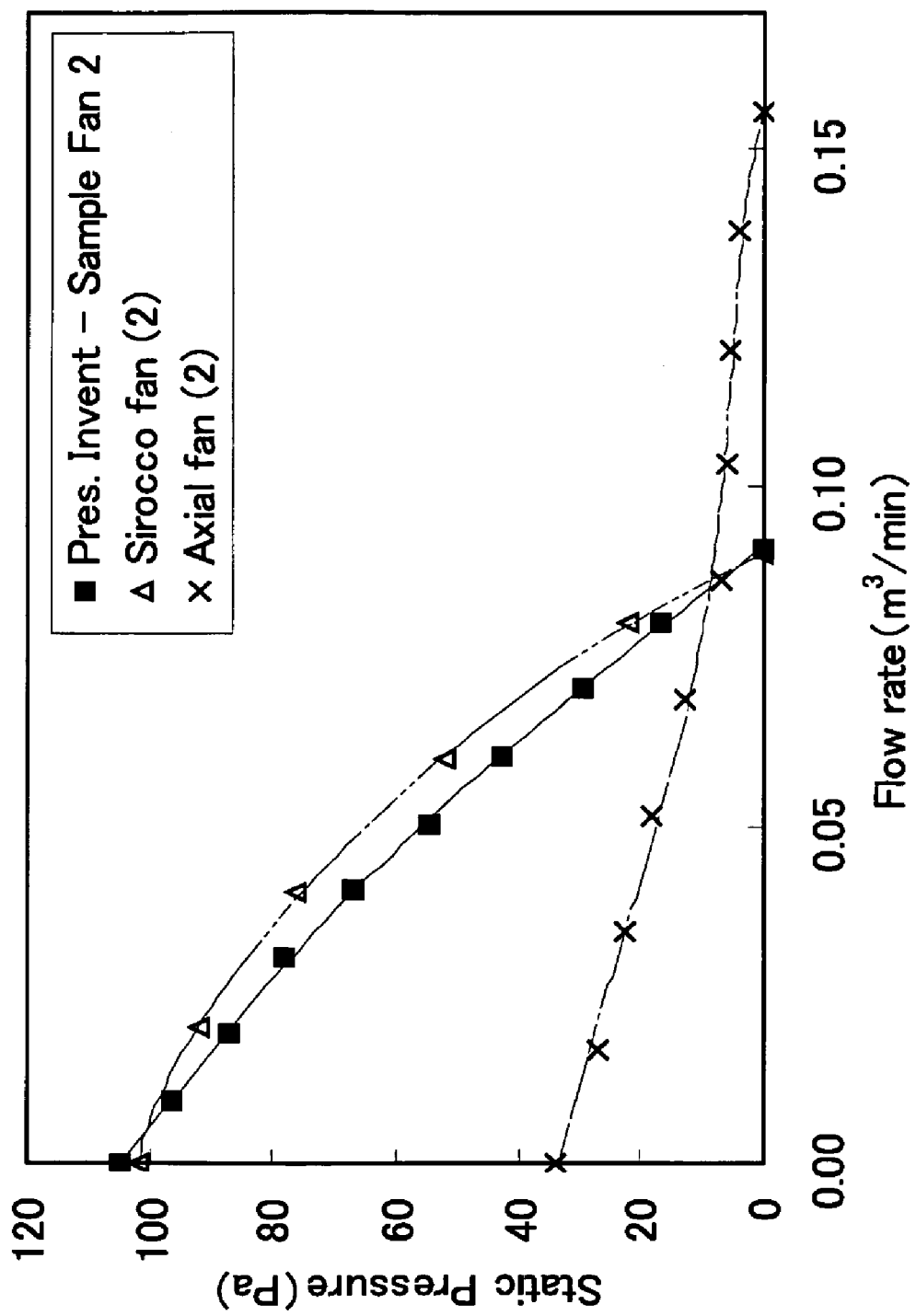
FIG. 10, a second chart, compares the performance of the centrifugal fan of the second embodiment with that of a conventional type of fan.
Figure 11:
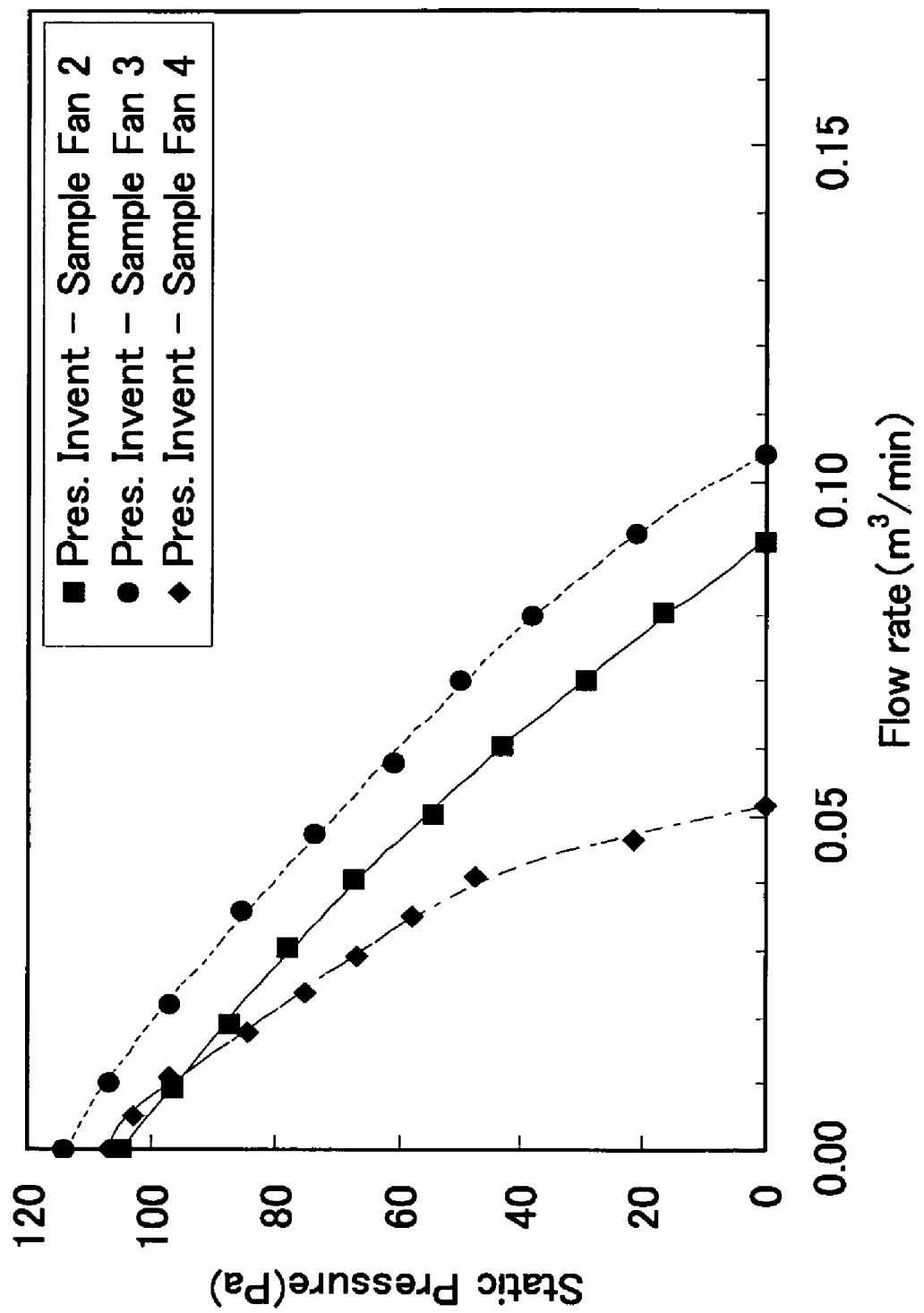
FIG. 11, a third chart, compares the performance of the centrifugal fans of the second embodiment and the first modified example thereof, and of a sample centrifugal fan further modified over the first modified example, with the performance of a conventional type of fan.

(5) Performance—The performance of the centrifugal fan 101, and of Modified Example 1 of that fan, is represented in FIGS. 10 and 11, respectively.

In FIG. 10 the volumetric-flow-static-pressure characteristics of the centrifugal fan 101 are graphed together with data on a conventional type of sirocco fan and an axial fan serving as examples for comparison therewith. In the graph, the centrifugal fan 101 is denoted "Pres. Invent. Sample Fan 2." Inasmuch as the sirocco fan and axial fan in this case are different fans from those represented in the FIG. 4 graph, they are respectively denoted "Sirocco Fan (2)" and "Axial Fan (2)."

The sizes of the housings for these fans are, respectively: Sample Fan 2—width 17 mm, height 17 mm, length 90 mm; Sirocco Fan (2)—width 51 mm, depth 51 mm, height 11 mm; and Axial Fan (2)—width 35 mm, height 35 mm, depth 10 mm. The volumes given that the housings are deemed to be parallelepipeds in form are: Sample Fan 2—26 cm$^3$; Sirocco Fan (2)—39 cm$^3$; and Axial Fan (2)—12.3 cm$^3$. The noise from these fans was: Sample Fan 2—29 dB (A); Sirocco Fan (2)—34 dB (A) and Axial Fan (2)—26 dB (A). Here, the fans were suspended in midair and a sound-level meter was set in front of the fan inlets to measure noise from a distance of 1.0 m.

The fact that the fan of Sample 2 possesses about equal capabilities to those of the conventional-type Sirocco Fan (2) will be understood from FIG. 10. On the other hand, the Sample 2 fan generates far less noise, and only occupies some two-thirds the volume of Sirocco Fan (2) besides. This means that the Sample 2 fan realizes a dramatic reduction in size and noise without compromising performance. This is moreover accompanied by an advantage in that in situations in which the fan of the present invention is to be installed in miniature electronic devices and portable electronic devices demanding high-density mounting, the fact that the fan is slender in form allows the available space within the case to be used efficiently.

Over the Sample 2 fan there is an advantage to the Axial Fan (2) in FIG. 10 in that because its volume is a little less than half that of the Sample 2 fan, in the same amount of space two can be installed. Nevertheless, even if two of the axial fans were to be set up in an in-line arrangement, they would not gain the static pressure of the Sample 2 fan. In particular, with the airflow volume being a less than 0.07 m$^3$/min flow capacity, they would not match a single Sample 2 fan in flow volume nor in static pressure.

Reference is made now to FIG. 11, in which, in addition to the data set forth in FIG. 10 on Sample Fan 2, data on two other fans pertaining to the present invention is furthermore added. One of the plots is data on the centrifugal fan of Modified Example 1. The other of the plots is data on a fan rendered, from the fan of Modified Example 1, more compact by eliminating the impeller-component 102b side to reduce the length to half, leaving only one opening 106. In the figure, the fan of Modified Example 1 is denoted Sample Fan 3; the more compact fan, Sample Fan 4.

The Sample 3 fan demonstrates, as a result of its vanes being upgraded to the forward-inclined form, performance that surpasses that of the Sample 2 fan in terms of airflow volume and static pressure. Meanwhile, the airflow volume of the Sample 4 fan example, having been made half the length and with one outlet, is less than that of the Sample Fan 3 and 2 examples. Nevertheless, with its static pressure being sufficiently high at an airflow volume of 0.03 m³/min or less in particular, the Sample 4 fan should serve well especially in applications in which compact fans are required.

EMBODIMENT 3

Figure 12:
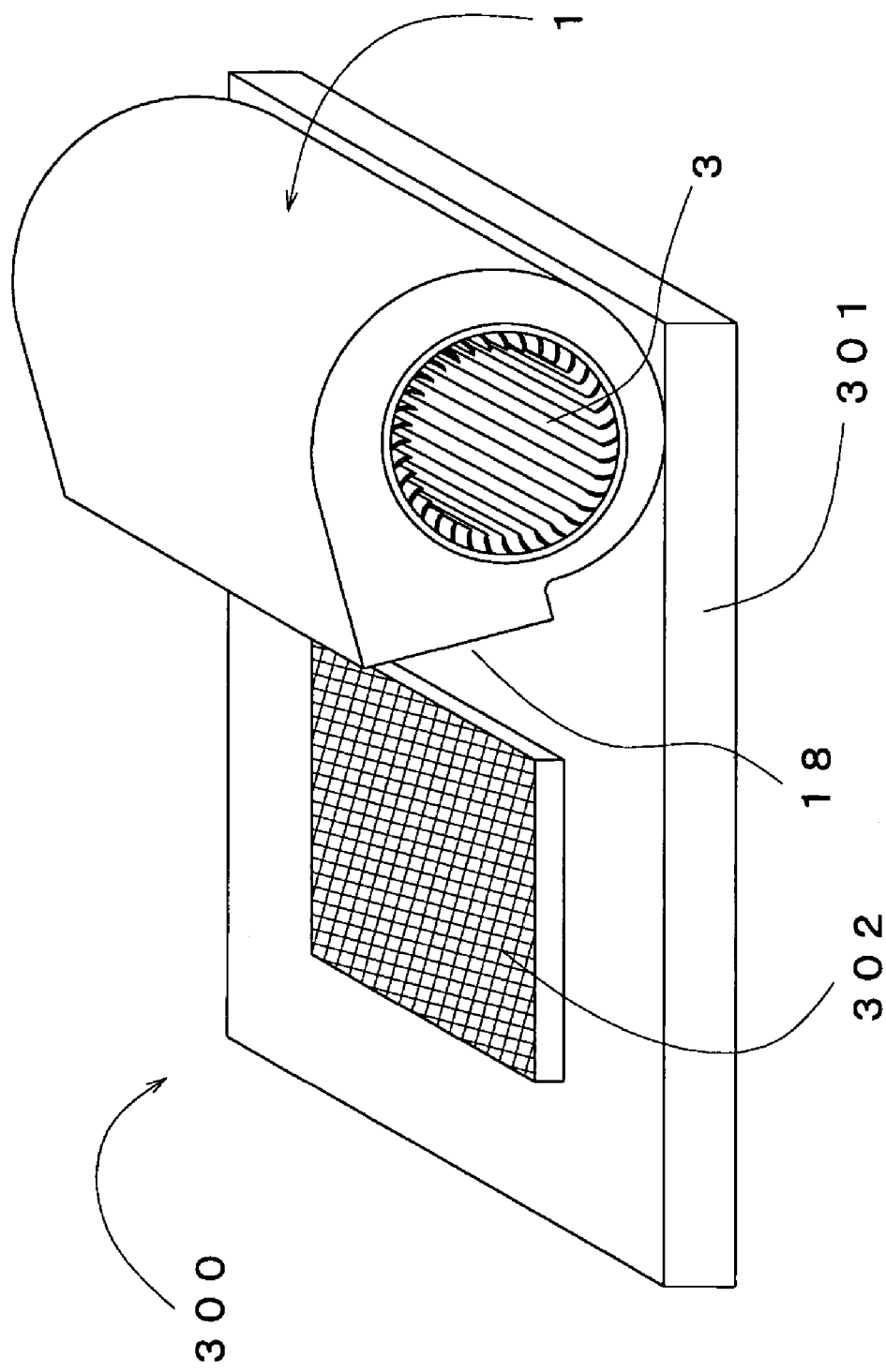
FIG. 12 is an oblique view of a cooling device involving the present invention in a third embodiment.

(1) Circuit Board Furnished with a Cooling Mechanism—Reference is made now to FIG. 12, which illustrates a circuit board 301 furnished with a cooling mechanism involving the present invention. A CPU 302, which generates heat, is installed on the circuit board 301 on its top side. The centrifugal fan 1 involving the present invention is set in place onto the board 301 in order to cool the CPU 302. The fan 1 is anchored with the delivery port 18 directed at the CPU 302, which is therein directly cooled by the stream of air blown on it from the delivery port 18. A heatsink may be mounted directly onto the CPU 302, on its top side. It is to be noted that in FIG. 12 the structure that anchors the centrifugal fan 1 onto the circuit board 301 has been omitted. As an embodiment, the present invention provides a method for cooling a heat-emitting component, CPU 302, mounted on a circuit board 301. The heat-emitting component cooling method includes the steps of the following: fixing a centrifugal fan of the invention either to the circuit board 301 or to a separate cooling component; and directing the delivery port 18 of the centrifugal fan to adjoin the heat-emitting component.

EMBODIMENT 4

Figure 13:
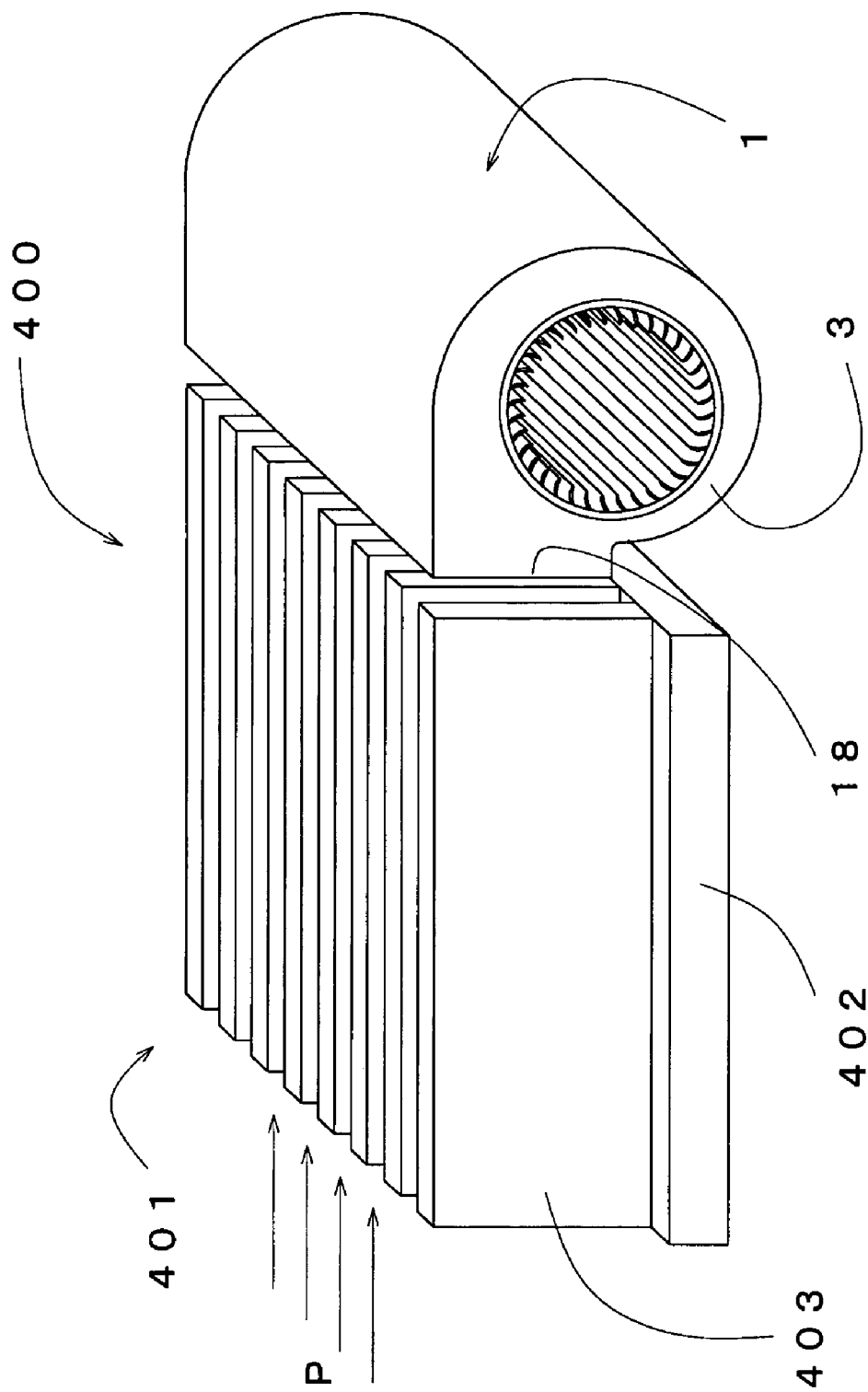
FIG. 13 is an oblique view of a cooling device involving the invention in a fourth embodiment.

(1) Cooling Device—Reference is made now to FIG. 13, which illustrates a cooling device 400 having to do with the present invention. This device is made up of a heatsink 401 and, fixed to it, the centrifugal fan 1 involving the present invention. The heatsink 401 is made up of a platelike base 402 on the top side of which heat-dissipating fins 403 are mounted, with the device that will be the cooling target being mounted on the bottom side of base 402. Air-circulation paths P are formed in between the heat-dissipating fins 403 as a heat-dissipating member. The delivery port 18 of the centrifugal fan 1 is arranged contacting the lateral side of the line of heat-dissipating fins 403, and is thus directed at—to send air into—the circulation paths P.

The large static pressure from the centrifugal fan 1 involving the present invention enables the fan to blow sufficient air even in between heat-dissipating fins at high density. A cooling device that, while being compact, demonstrates high cooling capacity can therefore be produced—a cooling device that not only develops large static pressure, but that is also quiet. It is to be noted that in FIG. 13 the structure that fixes the centrifugal fan 1 to the heatsink 401 has been omitted.

It will be appreciated that in order to heighten the cooling capacity, a fan such as the already described centrifugal fan 101, 201 or 251 may be utilized instead of the centrifugal fan 1.

Figure 14:
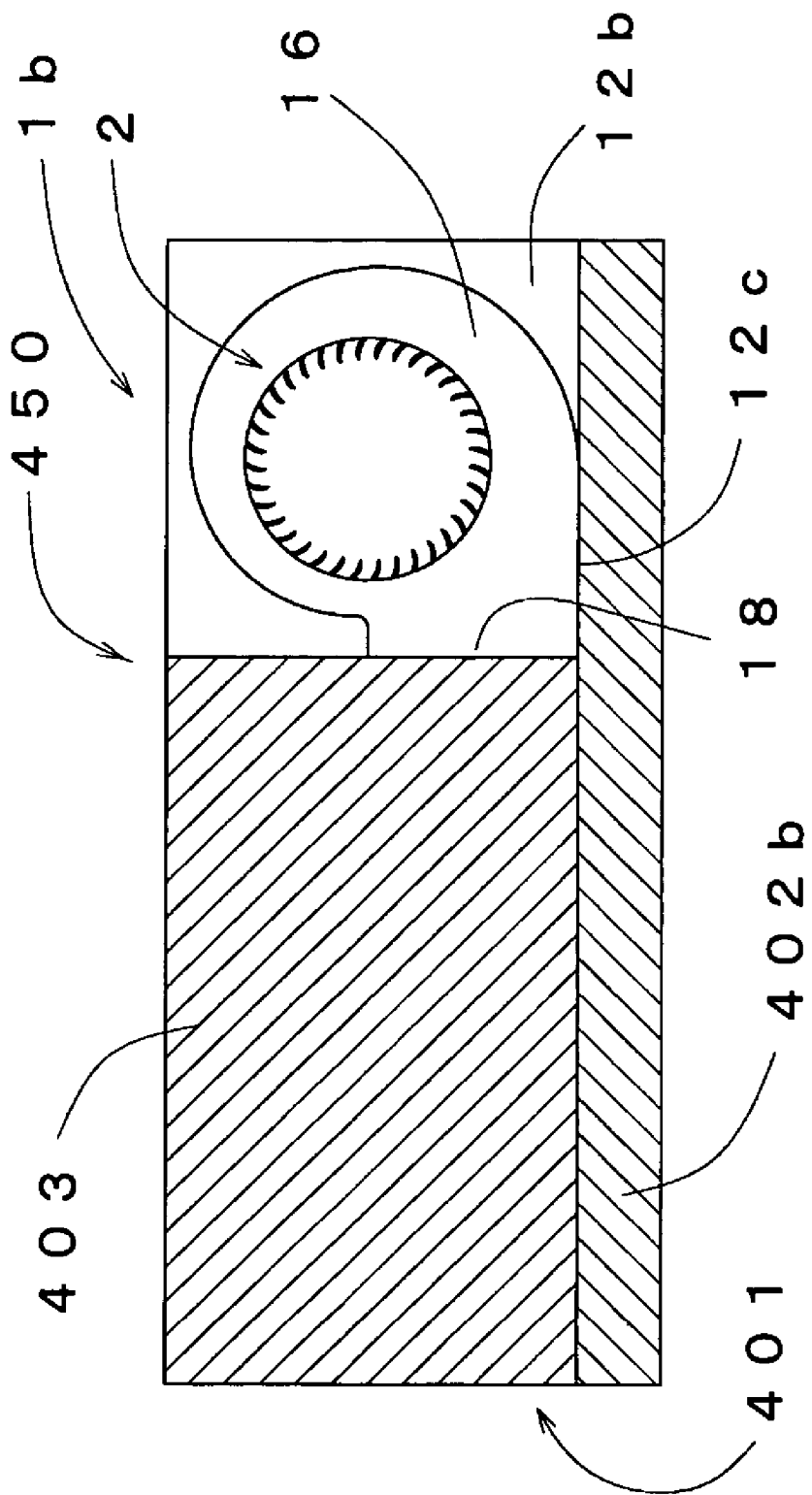
FIG. 14 is a modified example of the (fourth-embodiment) cooling device in FIG. 13.

(2) Modified Example 1—Reference is now made to FIG. 14, which is a sectional view, in a plane perpendicular to the rotational axis of the impeller 2, of a modified version of the FIG. 13 example. The base 402b in this cooling device 450 extends beyond an end of the heat-dissipating fins 403, wherein a centrifugal fan 1b is set in place on top of the extension. The draft cavity 16 in the centrifugal fan 1b is formed in between the housing 12b and the impeller 2, but in this example, one part 12c of the wall surfaces of the draft cavity 16 on the delivery port 18 end is constituted by the base 402b that forms a component of the heatsink 401. In this case the heat-dissipating fins 403 may extend up to the 12c section. As an embodiment, at least a portion of the housing 12b of the centrifugal fan 1b adopts the heatsink base (402b) as a constituent element, as illustrated in FIG. 14.

By rendering the configuration as is the case with the cooling device 450, the number of parts can be curtailed and at the same time, the cooling capacity is enhanced because the surface area in which the heatsink 401 is exposed to the airflow is increased. As one embodiment, Fig. 13 illustrates the heatsink 401 whose height is the smallest among the three dimensions, that is, the width, depth and height of the outer form of the heatsink.

(3) Modified Example 2—Reference is now made to FIG. 15, illustrating an example of a method of fastening the centrifugal fan 1b in FIG. 13 to a heatsink. The centrifugal fan 1b in FIG. 15 is set in place on top of a heatsink base 402c. In FIG. 15A a base 19b for the motor component is furnished with an extension 22b. The extension 22b then abuts against a lateral face of the heatsink base 402c, onto which it is screwed fast with screws 23.

In FIG. 15B the heatsink base 402c is furnished with an extension 22c that stands perpendicular with respect to the base. The centrifugal fan may be mounted on the heatsink base 402c with the rotational axis of the centrifugal fan being approximately perpendicular to the heatsink base. A base 19c of the motor component abuts against the lateral face of the extension 22c, onto which it is screwed fast with screws 23. As an embodiment, the base 19c of the motor may partially abut on and be fixed to the heatsink base 402. As another embodiment, one of the heatsink and the motor base includes an extension portion such as extension 22c, and the other of the heatsink and the motor base abuts on and is fixed to at least the extension portion of the one.

In either of these cases, because the base of the motor component is anchored directly to the base of a heatsink the mass of which is large, even if the motor is tending to vibrate, the vibration is solidly restrained. This property is especially effective for vibration and noise control in a situation as in the present invention in which an axially extensive centrifugal fan is rotated at high speed. It will be appreciated that the extensions 22b and 22c may be affixed with an adhesive or the like.

EMBODIMENT 5

Figure 16:
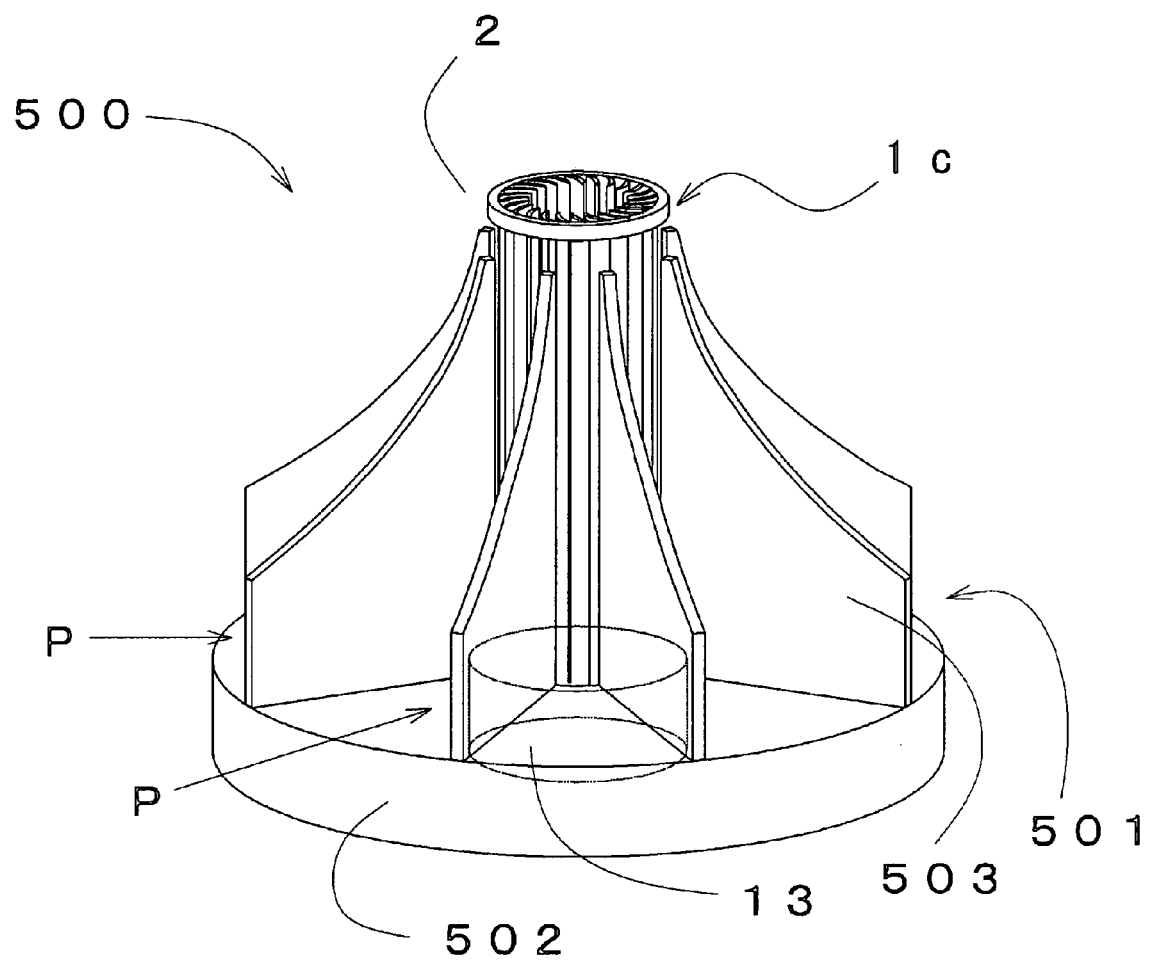
FIG. 16 is an oblique view of a cooling device involving the present invention in a fifth embodiment.

(1) Cooling Mechanism Having a Configuration in Which the Impeller Rotational Axis Is Upright from the Base—Reference is made to FIG. 16, which illustrates a cooling device 500 having to do with the present invention. This device is made up of a heatsink 501 and anchored to it, a centrifugal fan 1c involving the present invention. A drive unit 13 that rotationally drives the centrifugal fan 1c is in a setup in which it is embedded in a base 502 for the heatsink 501, wherein the impeller 2 stands upright with respect to the base 502. The drive unit 13 may be installed on the top side of the base 502, without being embedded in it. A plurality of heat-dissipating fins 503 as a heat-dissipating member is arranged on the impeller 2, radiating from its circumferential periphery. Air-circulation paths P are formed in between the heat-dissipating fins, wherein the paths P flare out radially.

Because the airflow that the impeller 2 involving the present invention delivers does not head perpendicularly with respect to the rotational axis, but inclines in a direction parting away from the opening in the impeller end, the heat-dissipating fins 503 are lent a lopsided form in which they broaden in width along the base to accord with the direction of the airflow.

Rendering the configuration in this way allows a cooling device of high cooling capacity to be produced.

It is to be understood that the impeller in FIG. 16 is one in which the housing has been taken away from the fan illustrated in FIG. 13, and does still satisfy Formula 1.

Figure 17:
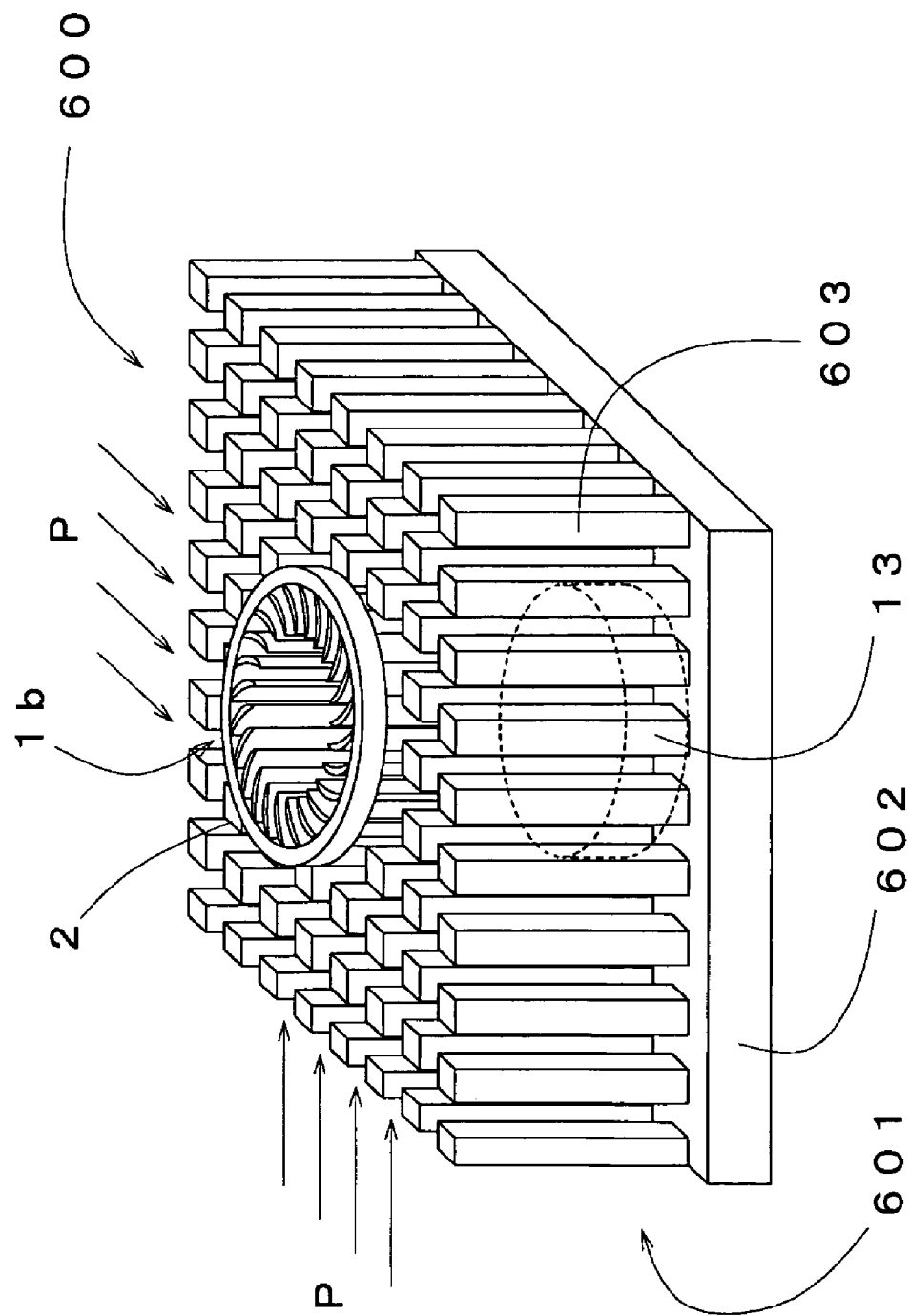
FIG. 17 is a modified example of the (fifth-embodiment) cooling device in FIG. 16.
Figure 20:
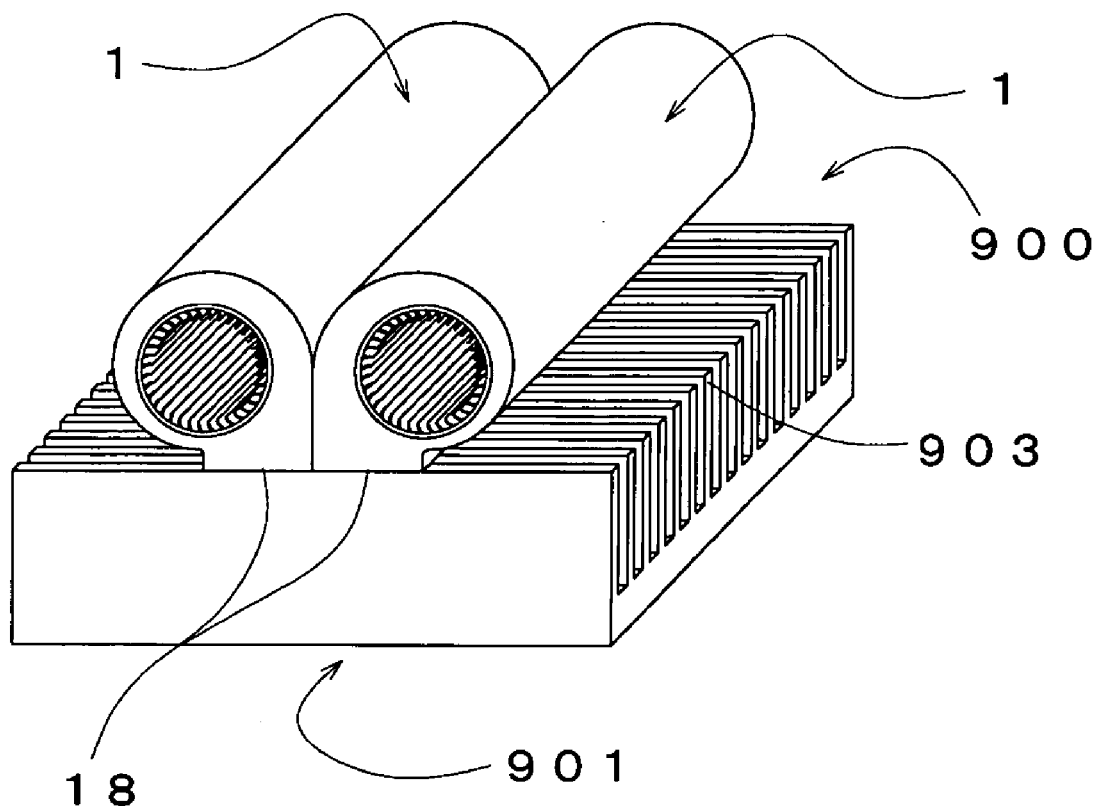
FIG. 20 is an oblique view of a cooling device involving the present invention in a seventh embodiment.

(2) Other Examples—Reference is now made to the FIG. 17 example, a modified version of that of FIG. 16, in which the length of the impeller 2 is made shorter. As a result of shortening the length of the impeller 2, the height of this cooling device 600 overall is made lower. The drive unit 13 for the impeller, likewise as with the cooling device 500, is in a setup in which it is embedded in, in this case, a base 602 for a heatsink 601. Heat-dissipating projections 603 in this example are in the form of slender square columns, which are arrayed in a latticework. The spacings between these heat-dissipating projections 603 as a heat-dissipating member constitute air-circulation paths P that stretch lengthwise and crosswise. If the individual heat-dissipating projections were even thinner, air-circulation paths that extend in diagonal orientations would also appear. As an embodiment, the heat-dissipatng memeber (e.g., heat-dissipating fins 403, 503 or heat-dissipating projections 603 of this specification) either has a form selected from a linear shape, a virgate shape, and a platelike shape, or in the form of a porous body. The interior of the heat-dissipating member can ventilate air. As yet another embodiment, the heat-dissipating members are constituted in major portion from a heat-transmissive substance, and defining the circulation paths. As yet another embodiment, the centrifugal fan is disposed either adjoining the heat-dissipating members, or in between two or more of the heat-dissipating members, as illustrated in FIGS. 16 and 17. The delivery port 18 of the centrifugal fan may be disposed either adjoining the heat-dissipating members, or in between two or more of the heat-dissipating members, as illustrated in FIG. 20.

Rendering the configuration in this way allows a reduced-height cooling device to be produced.

EMBODIMENT 6

Figure 18:
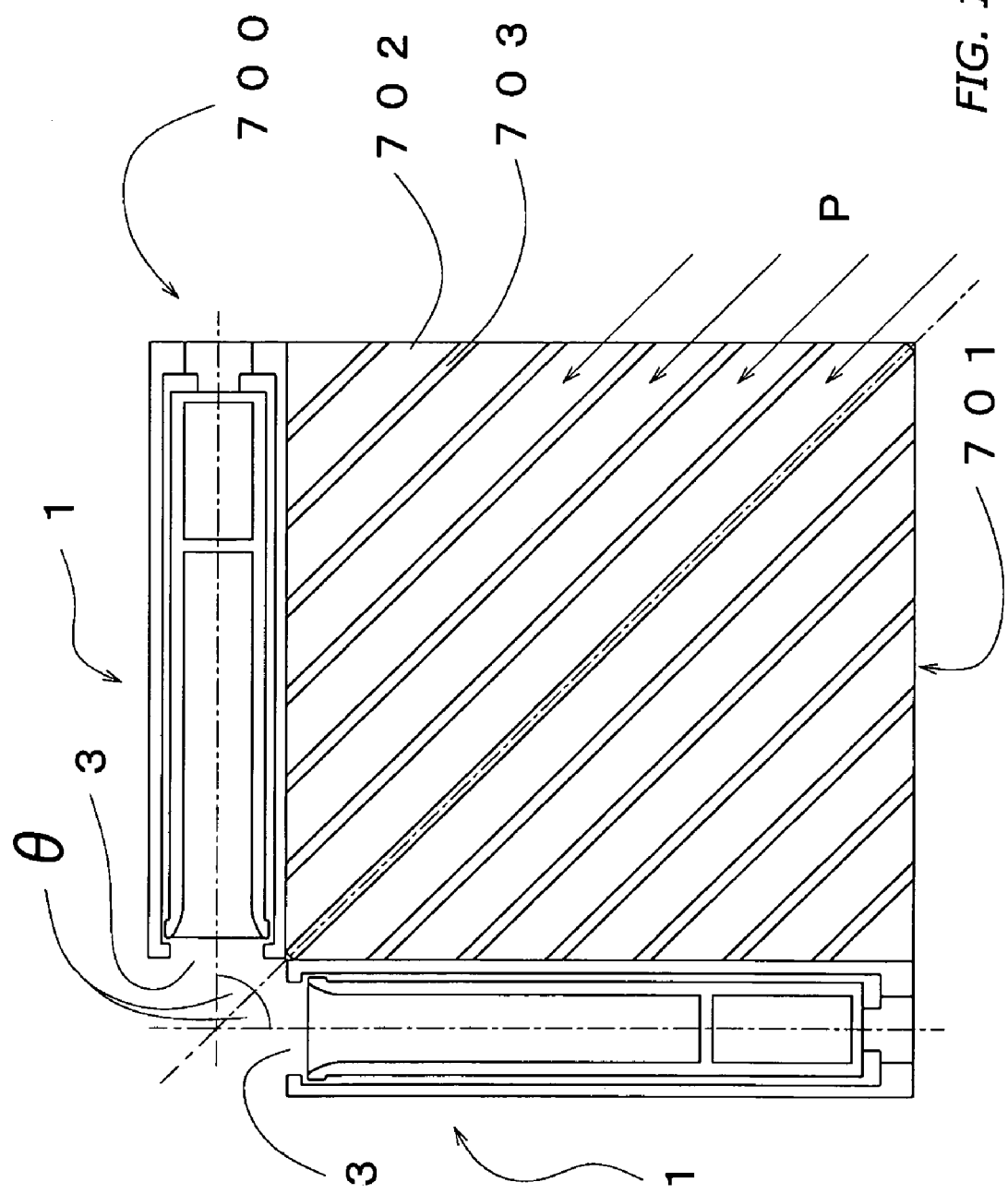
FIG. 18 is a plan view of a cooling device involving the present invention in a sixth embodiment.

(1) Cooling Device in Which Impeller Rotational Axis and Heat-Dissipating Projections Are Not at Right Angles—Referring to FIG. 18, the description turns now to cooling device 700 involving the present invention, illustrated in plan view in FIG. 18. The heatsink 701 in this device 700 is in the form of a regular flat square, and fixed to two adjoining sides thereof are centrifugal fans 1, 1 involving the present invention. The respective suction ports 3, 3 are positioned at a single corner of the heatsink 701. The heat-dissipating projections 703 are platelike; the plate intervals from the air circulation paths P. The direction along which the air circulation paths P extend forms an angle of 45 degrees with respect to the rotational axes of the two centrifugal fans 1, 1. In an embodiment, the circulation paths at least in the vicinity of the delivery port extend inclined at, on average, an angle θ with respect to the rotational axis of the centrifugal fan, as illustrated in FIG. 18. The angle θ may be within a range of from 10 degrees to 85 degrees. The result of a configuration of this sort is that the air currents blown onto the heatsink 701 along the base 702 are in a situation in which, angled at 45 degrees with respect to the rotational axes of the centrifugal fans 1, 1, they flow most readily. The centrifugal fans 1, 1 in FIG. 18, each being the same as the centrifugal fan illustrated in FIG. 13, exhibit high static pressure and at the same time are quiet.

The airflow that the centrifugal fans 1, 1 having to do with the present invention deliver is not perpendicular with respect to their rotational axis but inclines in a direction parting away from the suction port 3. For just this reason, rendering the heatsink in a configuration of this sort makes the forced air flow all the better, making enhanced cooling capacity possible.

Figure 19:
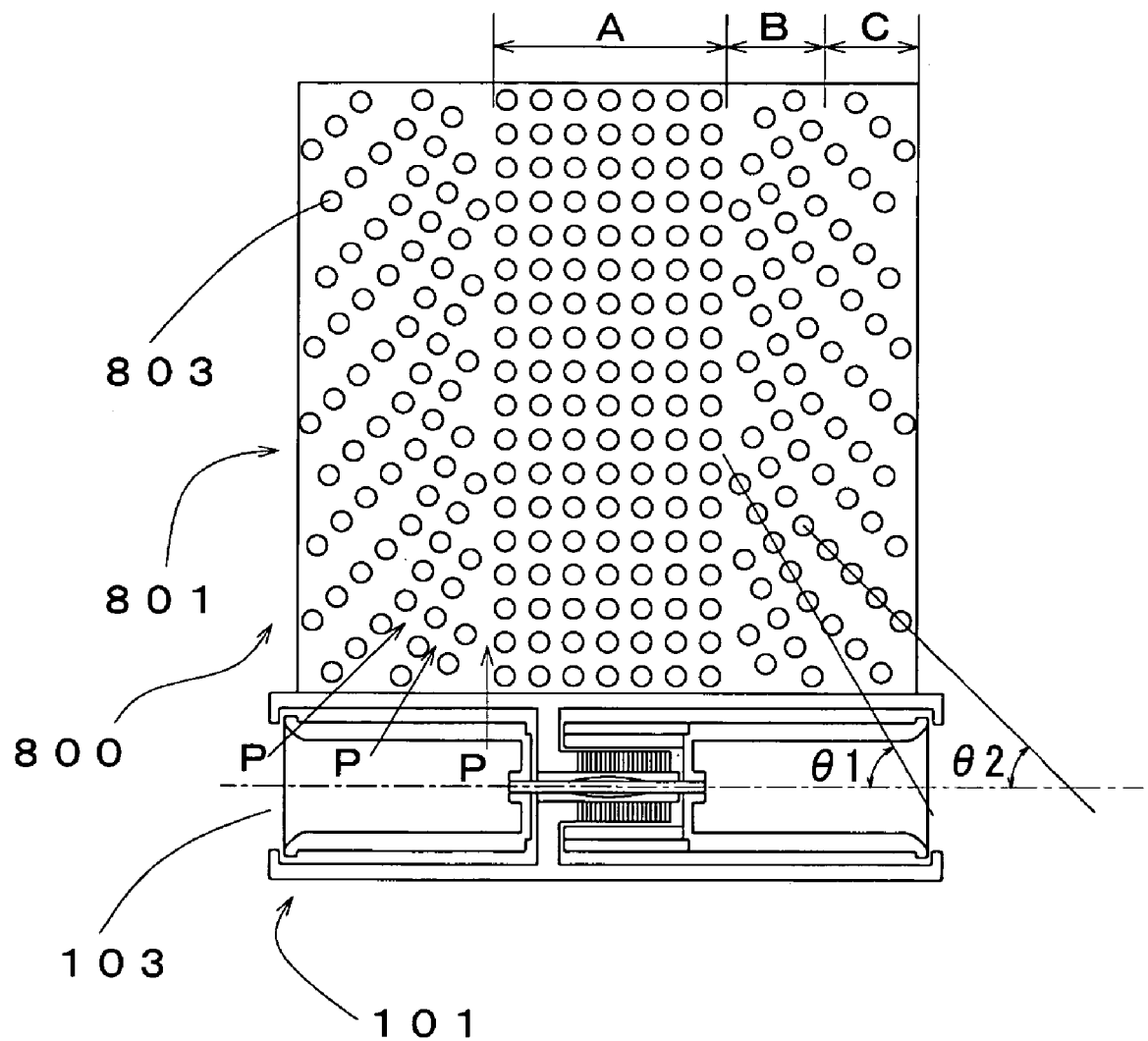
FIG. 19 is another plan view of a cooling device involving the present invention in the sixth embodiment.

(2) Other Examples—Reference is made to the FIG. 19 example, a cooling device in which rows of heat-dissipating projections 803 are inclined, like in FIG. 18, with respect to the rotational axis of the centrifugal fan 101. The heatsink 801 in this cooling device 800 is made up of three regions—A, B and C.

In region A, the central portion, the lines of heat-dissipating projections 803 are perpendicular with respect to the rotational axis of the centrifugal fan 101; in B, which is located to the outside of A, they form a 60-degree angle ($\theta_1$); in C, located further to the outside of B, they form a 45-degree angle ($\theta_2$).

As a result of arranging the heat-dissipating projections 803 in this manner the air circulation paths P that are formed in between the heat-dissipating projections differ according location A, B or C, wherein the paths extend respectively at angles of 90 degrees, 60 degrees and 45 degrees with respect to the rotational axis.

In the centrifugal fan 101 involving the present invention the delivered airflow not only inclines in a direction parting from the suction ports 103*a* and 103*b*, but also the inclination of the airflow differs according to location. That is, in the locations near the suction ports 103*a* and 103*b*, the angle that the airflow forms with the rotational axis is smaller, and as the locations are away from the inlets 103*a* and 103*b*, the angle approaches 90 degrees. The angle θ varies along the rotational axis of the centrifugal fan. The angle θ is relatively small in the region near the centrifugal-fan suction port, and gradually grows larger with separation along the rotational axis from the suction port.

The cooling device 800 features heat-dissipating projections arrayed in lines at angles, with respect to the rotational axis, that are varied according to axial location to accord with the tendency for the course of the airflow to vary according to axial location. In eliminating wasted flow of air, rendering a configuration of this sort enables enhanced cooling capacity.

EMBODIMENT 7

As an embodiment, the cooling device includes at least one duplicate of the centrifugal fan. With reference to FIG. 20, the description turns to a cooling device 900 that is configured with a heatsink 901 on the upper part of which centrifugal fans 1, 1 of the present invention are disposed. The delivery ports 18, 18 of the centrifugal fans 1, 1-being in close contact with the rows of heat-dissipating fins 903 on the heatsink 901—blow air into the crevices. The centrifugal fans 1, 1 in FIG. 20, each being the same as the centrifugal fan illustrated in FIG. 13, exhibit high static pressure and at the same time are quiet.

Owing to the high static pressure of the centrifugal fans 1, 1 of the present invention, air can be streamed in between the heat-dissipating fins 903 even in situations in which they are configured at high density. The cooling device 900 can therefore be lent a high cooling capacity while being relatively small-scale.

EMBODIMENT 8

Figure 21:
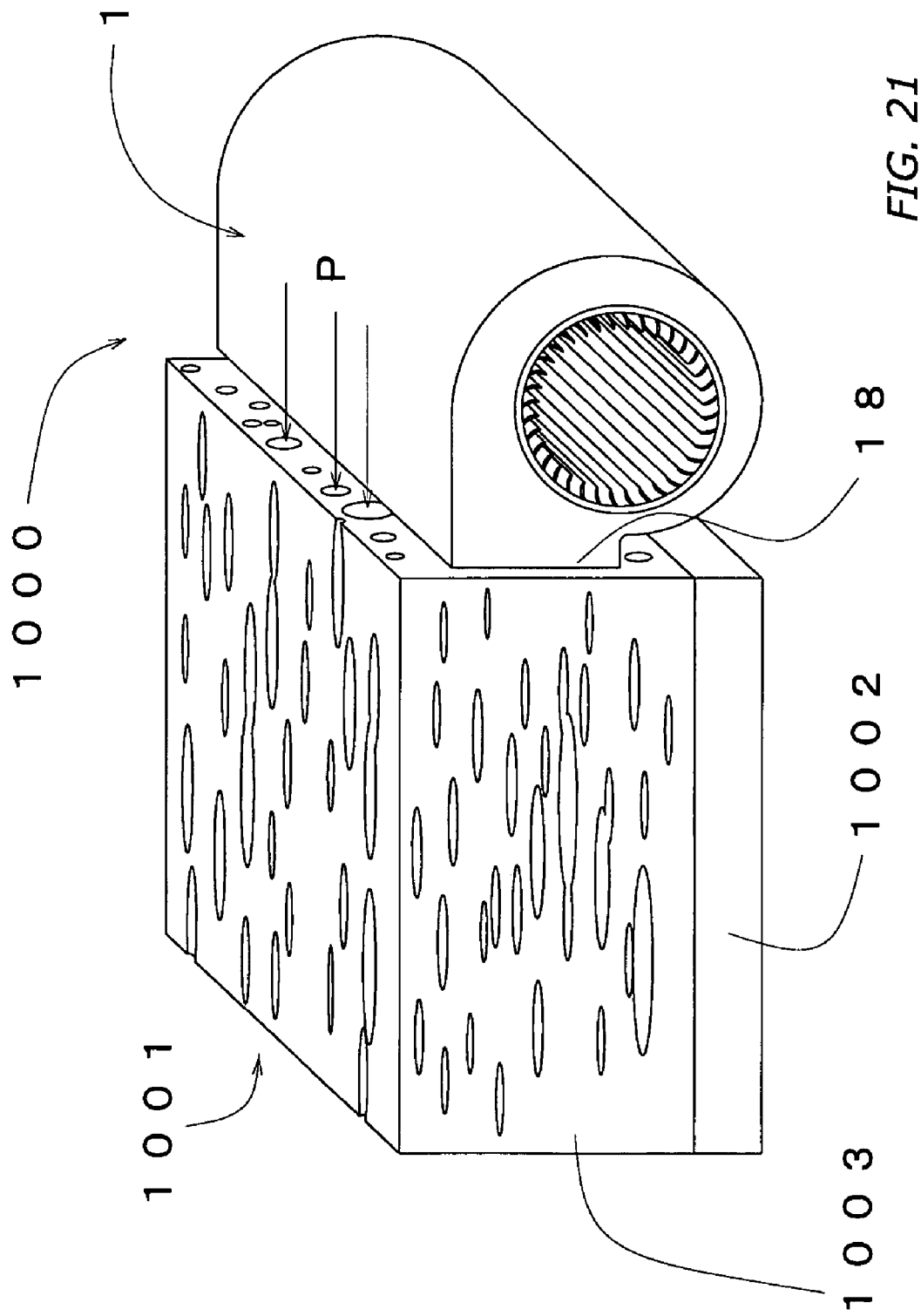
FIG. 21 is an oblique view of a cooling device involving the present invention in an eighth embodiment.

As an embodiment, the heat-dissipating members are at least partially constituted from a heat-transmissive porous substance, the interior of which is air-permeable: and the heat-transmissive porous substance has a pore volume ratio of between 50% inclusive and less than 90%. Reference is made to FIG. 21, which illustrates a cooling device 1000 in which a heatsink 1001 is constituted by a base 1002 and, adhered to its top side, an aluminum foam block 1003. The aluminum foam block 1003 was prepared by further unidirectionally rolling aluminum foam of 90% pore volume so as to increase its length 40% and lower the pore volume to 70% to raise the density and heighten the thermal conductivity, and at the same time so as to sustain the air permeability along the direction in which it was drawn. The pores resulting from the rolling were also stretched unidirectionally, forming air circulation paths P.

The course along which the aluminum foam was drawn is crosswise in the figure; air is forced in along this course from a centrifugal fan 1 involving the present invention. The base 1002 is a thick plate made of copper—thus very efficiently absorbing and transmitting to the aluminum foam block 1003 heating-element emitted heat—and is bonded to the aluminum foam block 1003 with a silver paste.

The high static pressure that the centrifugal fan 1 involving the present invention generates enables sufficient air-flow to be delivered even into aluminum foam block having a comparatively high flow resistance, which makes it possible to produce a cooling device that although small-scale has a high cooling capacity.

EMBODIMENT 9

Figure 22:
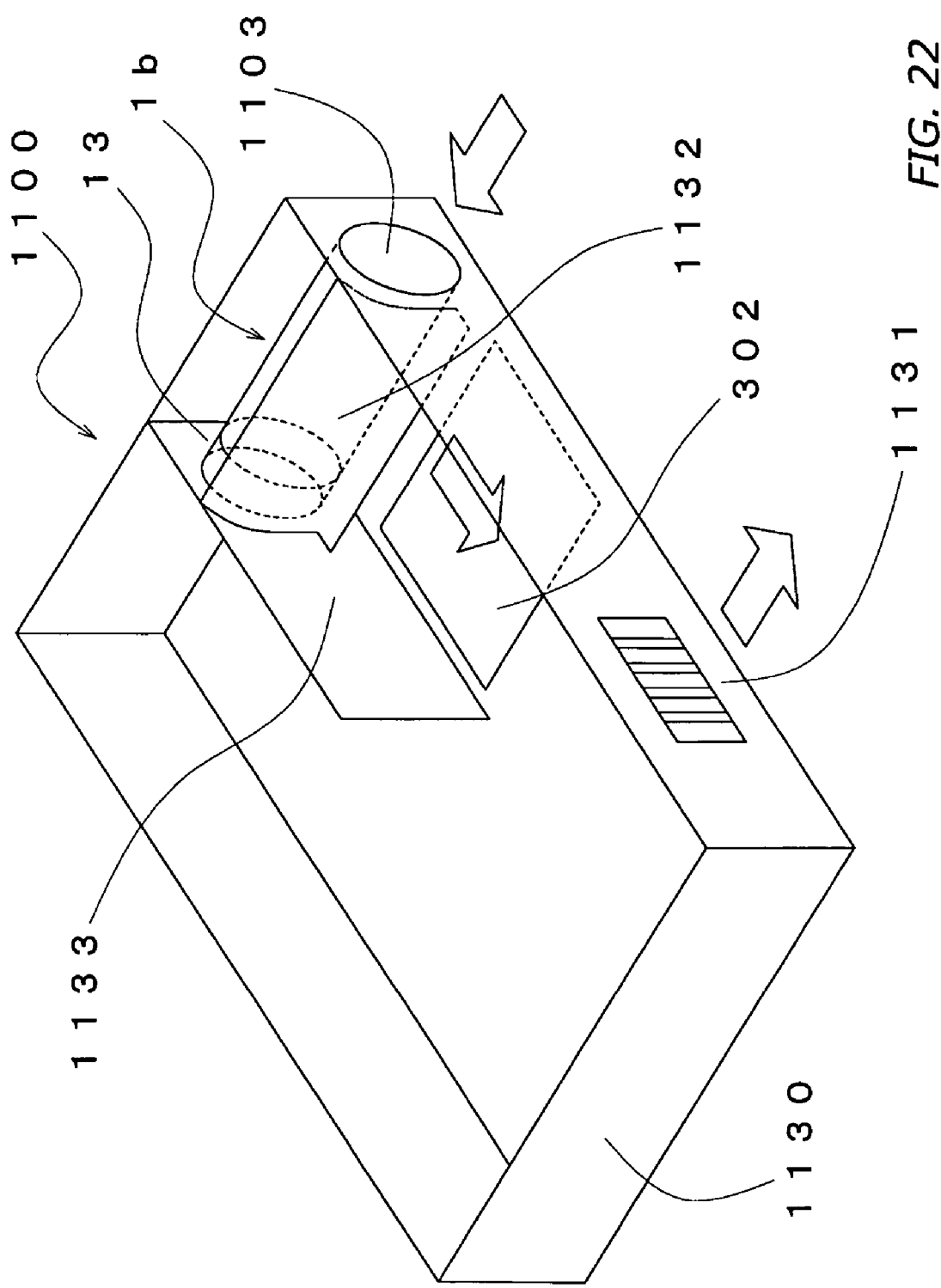
FIG. 22 is an oblique view of a device involving the present invention in a ninth embodiment.

(1) Cooling Mechanism for Device Having a Flat Case—Reference is made to FIG. 22, which represents a device in which the centrifugal fan 1b involving the present invention is installed inside a case 1130. A notebook personal computer can be given as a specific example of the device. Particulars that have no direct relation to cooling are omitted from the figure, which furthermore is a view in which the top plate of the case has been taken off to make the interior structure easier to see. Furnished on a lateral side of the case 1130 is an entry port 1103, along the inner side of which the centrifugal fan 1b is set in place. The centrifugal fan 1b is fixed to the case via the rotatory drive unit 13. Surrounding the centrifugal fan 1b, a path for the flow of air is formed by the inner side of the case 1130 and by flow-regulating vanes 1132 and 1133 and is therein configured so that the fanned air is directed at the CPU 302. Although omitted from the figure, a heatsink is mounted on the CPU 302.

Air that is sucked in through the entry port 1103, after cooling the CPU 302 by flowing along the direction of the arrow in the figure, is discharged to the exterior through an exhaust port 1131 in a lateral side of the case. Because it generates high static pressure, the centrifugal fan 1b involving the present invention enables the required areas to be reliably cooled even in situations—in slim-profile devices especially—in which resistance on the airstream is great.

What is more, inasmuch as the centrifugal fan of the present invention is diametrically small and thus air can be drawn in through a small-diameter opening, in fan applications in slim-profile cases of this sort the port for drawing in air can be provided in a lateral side of the case. The fact that the temperature of the air that is sucked in is lowered enables more efficient cooling compared to structures in which air is drawn through the bottom or top sides. The exhaust port, indicated by 1131 in the figure, in the lateral side of the case need not necessarily be provided. Because its static pressure is high, the centrifugal fan employed in the present invention can also discharge air via gaps present here and there in the case.

Figure 23:
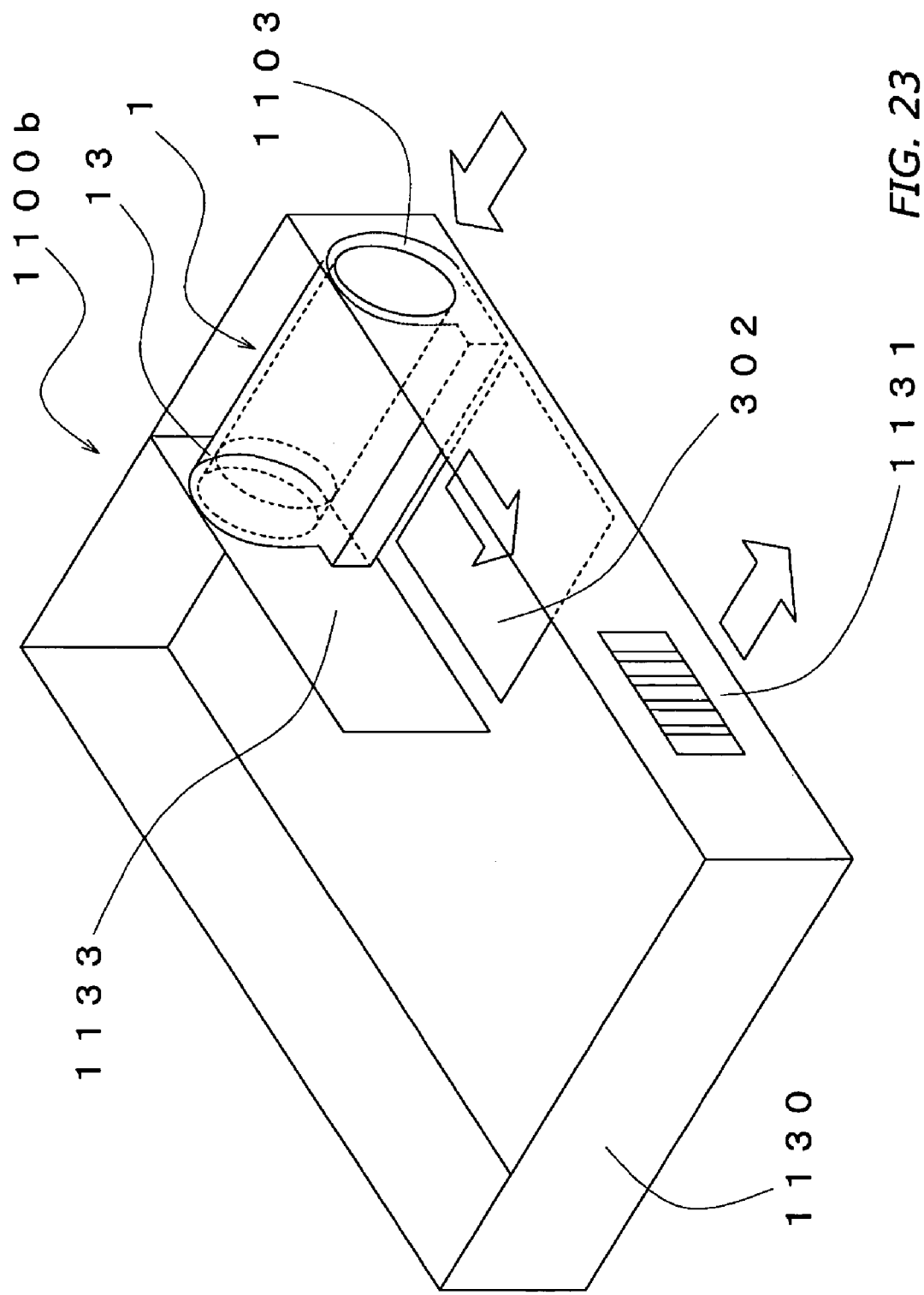
FIG. 23 is a modified example of the (ninth-embodiment) cooling device in FIG. 22.

(2) Modified Examples—In FIG. 23 is a version in which the centrifugal fan 1b installed in the FIG. 22 example is replaced with the centrifugal fan 1 that has the housing. Its cooling capacity is about the same as the device of FIG. 22, but installed in it instead of the centrifugal fan 1b, is the centrifugal fan 1 including the housing. Because this means that the centrifugal fan and peripheral parts are a single component, the operation of placing parts into the case interior is facilitated.

In the above-described Embodiments 1 through 9 the impeller of the centrifugal fans is manufactured by injection molding with fiber-reinforced plastic as the main ingredient, in which all-aromatic liquid crystal polyester (brand name: Vectra®) is the source material. This is a type of synthetic resin referred to as a liquid-crystal polymer. Liquid-crystal polymers in general demonstrate high fluidity when they are used for injection molding, and are of high rigidity—the resin utilized in the embodiments of the present invention has exhibited a Young's modulus that surpasses $1.2 \times 10^{-2}$ GPa·m³ by far. An impeller thus produced is highly rigid against stress in the direction in which the vanes curve, and deforms only slightly from the wind pressure and centrifugal force that are associated with high-speed rotation.

As to substances for the impeller, in addition to the foregoing it may be formed with fiber-reinforced resins such as CFRP, or metals such as aluminum as the source material.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A centrifugal fan comprising:
   an impeller 25 mm or less in outer diameter, said impeller rotatable about a rotational axis and having a plurality of vanes disposed about the rotational axis; and
   a motor for rotating said impeller at rpm such that the centripetal acceleration along the impeller outer perimeter is $1.0 \times 10^4$ m/s² or more during rated operation; and
   when w is the inter-vane lateral separation along the periphery of said impeller, v is the kinematic viscosity of air, and $v_\theta$ is the magnitude of the tangential velocity of said impeller at its outer perimeter during rated revolution, the centrifugal fan satisfies $$v_\theta \times w/v < 1.0 \times 10^3 \qquad \text{Formula (1)}.$$

2. A centrifugal fan as set forth in claim 1, wherein said vanes axially extend at a radial separation from the rotational axis and encompass along the rotational axis a region defining an approximately circular-cylindrical cavity which is open at at least one axial end, and
   letting D be the outer diameter of said impeller, h be the effective length of said impeller along its rotational axis, and n be the number of openings that said impeller has, then the centrifugal fan satisfies $$1 \leq h/(nD) \leq 20 \qquad \text{Formula (2)}.$$

3. A centrifugal fan as set forth in claim 1, further comprising a housing defining an interior space for accommodating said impeller, said housing having:

a suction port located on an extension of the rotational axis of said impeller and a delivery portion.

4. A centrifugal fan as set forth in claim 3, wherein: an inner peripheral surface of said housing has a conformation in which the clearance in between the inner peripheral surface of said housing and the circumference of said impeller expands running in the direction the impeller rotates and heading toward the delivery port; and letting d be the shortest gap in between said impeller circumference and the inner peripheral surface of said housing, then the centrifugal fan satisfies $$v_\theta \times d/v < 1.0 \times 10^3 \quad \text{Formula (3)}.$$

5. A centrifugal fan as set forth in claim 1, said motor comprising a bearing mechanism and a rotational drive mechanism; wherein:

said bearing mechanism is one selected from an oil-impregnated porous material bearing mechanism, a hydrodynamic bearing mechanism, and a magnetic levitation bearing mechanism;

said impeller has, on a projecting portion connected with either the circumferential portion or an axial end portion of said impeller, a circuital surface serving as a bearing surface; and via said circuital surface said bearing mechanism rotatably supports said impeller.

6. A centrifugal fan as set forth in claim 1, wherein in a plane perpendicular to the rotational axis, the cross-sectional form of each of the vanes composing said impeller has an axis of symmetry, and the axis of symmetry is coincident with a radius of said impeller.

7. A centrifugal fan as set forth in claim 1, wherein the vanes of said impeller are constituted from a synthetic resin whose main ingredient is a thermotropic liquid crystal polymer.

8. A centrifugal fan as set forth in claim 1, wherein, with i being the shortest separation between the vanes composing said impeller and h being the impeller axial length, letting $S_{out}$ be the sum of adding together the products of h and i around the circumference of the impeller, and $S_{in}$ be the sum surface area of at least one opening in said impeller, then the centrifugal fan satisfies $$\leq S_{out}/S_{in} \leq 30 \quad \text{Formula (4)}.$$

9. A centrifugal fan as set forth in claim 1, wherein along an impeller opening, on the axial end of the vanes at least a portion of the radially inward corner of the vanes is chamfered.

10. A method for cooling a heat-emitting component mounted on a circuit board, the heat-emitting component cooling method comprising:

fixing a centrifugal fan as recited in claim 3 either to the circuit board or to a separate cooling component;

directing the delivery port of the centrifugal fan to adjoin the heat-emitting component.

11. A cooling device comprising:

a heatsink having in its interior circulation paths through which air can circulate and that communicate with the heatsink exterior, and being constituted from heat-dissipating members either having a form selected from a linear shape, a virgate shape, and a platelike shape, transformation of these shapes, or being in the form of a porous body the interior of which air can ventilate, said heat-dissipating members being constituted in major portion from a heat-transmissive substance, and defining the circulation paths; and a centrifugal fan as recited in claim 1, said centrifugal fan being disposed either adjoining said heat-dissipating members, or in between two or more of said heat-dissipating members.

12. A cooling device comprising:

a heatsink having in its interior circulation paths the interior of which air can ventilate, said heatsink being constituted from heat-dissipating members either having a form selected from a linear shape, a virgate shape, and a platelike shape, or being in the form of a porous body the interior of which air can ventilate, said heat-dissipating members being constituted in major portion from a heat-transmissive substance, and defining the circulation paths; and a centrifugal fan as recited in claim 1, said centrifugal fan further including a housing defining an interior space for accommodating said impeller.

13. A cooling device comprising: a heatsink having in its interior circulation paths the interior of which air can ventilate, the heatsink being constituted from heat-dissipating members either having a form selected from a linear shape, a virgate shape, and a platelike shape, or being in the form of a porous body the interior of which air can ventilate, said heat-dissipating members being constituted in major portion from a heat-transmissive substance, and defining the circulation paths; and a centrifugal fan as recited in claim 3, said delivery port in said centrifugal fan being disposed either adjoining said heat-dissipating members.

14. A cooling device as set forth in claim 12, wherein: said heatsink further includes a heatsink base in contact with a heat-emitting object being a cooling target; said heat-dissipating members are mounted on said heatsink base; and at least a portion of said housing of the centrifugal fan adopts said heatsink base as a constituent element.

15. A cooling device as set forth in claim 13, wherein: said heatsink further includes a heatsink base in contact with a heat-emitting object being a cooling target;

said heat-dissipating members are mounted on said heatsink base; and at least a portion of said housing of the centrifugal fan adopts said heatsink base as a constituent element.

16. A cooling device as set forth in claim 12, wherein:

said heatsink further includes a heatsink base in contact with a heat-emitting object being a cooling target, said heat-dissipating members being attached to said heatsink base; and said centrifugal fan includes a motor base partially abutting on and fixed to said heatsink base, and a bearing mechanism mounted on said motor base, wherein via said bearing mechanism said impeller is relatively rotatably supported with respect to said motor base.

17. A cooling device as set forth in claim 13, wherein: said heatsink further includes a heatsink base in contact with a heat-emitting object being a cooling target, and said heat-dissipating members are mounted on the heatsink base; and said centrifugal fan includes a motor base, and a bearing mechanism mounted on said motor base, wherein via said bearing mechanism said impeller is relatively rotatably supported with respect to said motor base.

18. A cooling device as set forth in claim 16, wherein: one of said heatsink and said motor base includes an extension portion; and the other of said heatsink and said motor base abuts on and is fixed to at least the extension portion of the one.

19. A cooling device as set forth in claim 17, wherein: one of said heatsink and said motor base includes an extension portion; and the other of said heatsink and said motor base abuts on and is fixed to at least the extension portion of the one.

20. A cooling device as set forth in claim 11, wherein: said heatsink further includes a heatsink base in contact with a heat-emitting object, said heat-dissipating members being attached to said heatsink base; and said centrifugal fan is mounted on said heatsink base with the rotational axis of said centrifugal fan being approximately perpendicular to said heatsink base.

21. A cooling device as set forth in claim 13, wherein: said heatsink further includes a heatsink base in contact with a heat-emitting object on the flat surface, said heat-dissipating members being attached to said heatsink base; and said centrifugal fan is mounted on said heatsink base with the rotational axis of said centrifugal fan being approximately perpendicular to said heatsink base.

22. A cooling device as set forth in claim 12, wherein: among the three dimensions of width, depth and height of said heatsink in outer form the height is smallest;

both ends of said centrifugal fan along its rotational axis are situated within the extent of the heatsink height; and the centrifugal-fan rotational axis extends along, and the centrifugal fan is positioned on a lateral side of said heatsink corresponding to, either the width direction or the depth direction of said heatsink.

23. A cooling device as set forth in claim 13, wherein: among the three dimensions of width, depth and height of said heatsink in outer form the height is smallest;

both ends of said centrifugal fan along its rotational axis are situated within the extent of the heatsink height; and the centrifugal-fan rotational axis extends along, and the centrifugal fan is positioned on a lateral side of said heatsink corresponding to, either the width direction or the depth direction of said heatsink.

24. A cooling device as set forth in claim 22, wherein: said circulation paths at least in the vicinity of said delivery port extend inclined at, on average, an angle $\theta$ with respect to the rotational axis of said centrifugal fan; and the angle $\theta$ is within a range of from 10 degrees to 85 degrees.

25. A cooling device as set forth in claim 23, wherein: said circulation paths at least in the vicinity of said delivery port extend inclined at, on average, an angle $\theta$ with respect to the rotational axis of said centrifugal fan; and the angle $\theta$ is within a range of from 10 degrees to 85 degrees.

26. A cooling device as set forth in claim 24, wherein: the angle $\theta$ varies along the rotational axis of said centrifugal fan; and the angle $\theta$ is relatively small in the region near said centrifugal-fan suction port, and gradually grows larger with separation along the rotational axis from said suction port.

27. A cooling device as set forth in claim 25, wherein: the angle $\theta$ varies along the rotational axis of said centrifugal fan; and the angle $\theta$ is relatively small in the region near said centrifugal-fan suction port, and gradually grows larger with separation along the rotational axis from said suction port.

28. A cooling device as set forth in claim 12, further comprising at least one duplicate of the centrifugal fan recited therein.

29. A cooling device as set forth in claim 13, further comprising at least one duplicate of the centrifugal fan recited therein.

30. A cooling device as set forth in claim 22, further comprising at least one duplicate of the centrifugal fan recited therein.

31. A cooling device as set forth in claim 23, further comprising at least one duplicate of the centrifugal fan recited therein.

32. A cooling device as set forth in claim 11, wherein: said heat-dissipating members are at least partially constituted from a heat-transmissive porous substance, the interior of which is air-permeable; and said heat-transmissive porous substance has a pore volume ratio of between 50% inclusive and less than 90%.

33. A cooling device as set forth in claim 12, wherein: said heat-dissipating members are at least partially constituted from a heat-transmissive porous substance, the interior of which is air-permeable; and said heat-transmissive porous substance has a pore volume ratio of between 50% inclusive and less than 90%.

34. A cooling device as set forth in claim 20, wherein: said heat-dissipating members are at least partially constituted from a heat-transmissive porous substance, the interior of which is air-permeable; and said heat-transmissive porous substance has a pore volume ratio of between 50% inclusive and less than 90%.

35. A cooling device as set forth in claim 22, wherein: said heat-dissipating members are at least partially constituted from a heat-transmissive porous substance, the interior of which is air-permeable; and said heat-transmissive porous substance has a pore volume ratio of between 50% inclusive and less than 90%.

36. A device equipped with a cooling mechanism, the device comprising:

a centrifugal fan as recited in claim 1;

a flat-sided case, an entry port being formed in a lateral side of said case, and said case defining an interior space for accommodating said centrifugal fan; and a heat-emitting object installed inside said case.

37. A cooling-mechanism-equipped device as set forth in claim 36, further comprising a flow-regulating part installed inside said case and disposed adjacent said centrifugal fan, for restricting the flow of air inside said case.

38. A centrifugal fan comprising: an impeller 25 mm or less in outer diameter, said impeller rotatable about a rotational axis and having a plurality of vanes disposed about the rotational axis; and a motor for rotationally driving said impeller at rpm such that the centripetal acceleration along the impeller outer perimeter is $1.0 \times 10^4$ m/s$^2$ or more during rated operation ; and a housing defining an interior space for accommodating said impeller, said housing having:

a suction port located on an extension of the rotational axis of said impeller and a delivery portion; and an inner peripheral surface of said housing having a conformation in which the clearance in between the inner peripheral surface of said housing and the circumference of said impeller expands running in the direction the impeller rotates and heading toward the delivery port; and when d is the shortest gap in between said impeller circumference and the inner peripheral surface of said housing, v is the kinematic viscosity of air, and $v_\theta$ is speed of said impeller during rated revolution, then the centrifugal fan satisfies $$v_\theta \times d / v < 1.0 \times 10^3 \quad \text{Formula (3).}$$

* * * * *